US012696751B2

(12) United States Patent
Lee et al.

(10) Patent No.:　　US 12,696,751 B2
(45) Date of Patent:　　　　Jul. 28, 2026

(54) INTEGRATED CIRCUIT DEVICES

(71) Applicant: Samsung Electronics Co., Ltd.,
Suwon-si (KR)

(72) Inventors: Sungmoon Lee, Suwon-si (KR);
Sangcheol Na, Suwon-si (KR); **Sora
You, Suwon-si (KR); Kyoungwoo Lee**,
Suwon-si (KR); Minchan Gwak,
Suwon-si (KR); Youngwoo Kim,
Suwon-si (KR); Jinkyu Kim, Suwon-si
(KR); Seungmin Cha, Suwon-si (KR)

(73) Assignee: **SAMSUNG ELECTRONICS CO.,
LTD.**, Suwon-si (KR)

( * ) Notice: Subject to any disclaimer, the term of this
patent is extended or adjusted under 35
U.S.C. 154(b) by 371 days.

(21) Appl. No.: 18/379,083

(22) Filed: Oct. 11, 2023

(65) Prior Publication Data

US 2024/0128161 A1　　Apr. 18, 2024

(30) Foreign Application Priority Data

Oct. 14, 2022　(KR) ........................ 10-2022-0132726

(51) Int. Cl.
H10D 30/43　　　(2025.01)
H10D 30/67　　　(2025.01)
(Continued)

(52) U.S. Cl.
CPC ............ *H10W 20/20* (2026.01); *H10D 30/43*
(2025.01); *H10D 30/6729* (2025.01);
(Continued)

(58) Field of Classification Search
CPC ............... H10W 20/20; H10W 20/427; H10W
20/0698; H10W 20/0234; H10W 20/0242;
(Continued)

(56) References Cited

U.S. PATENT DOCUMENTS 9,691,658 B1　6/2017　Alptekin et al.
10,985,057 B2　4/2021　Jourdain et al.
(Continued)

FOREIGN PATENT DOCUMENTS

KR　　1020010097949 A　11/2001
KR　　　100668836 B1　1/2007

*Primary Examiner* — Shahed Ahmed
(74) *Attorney, Agent, or Firm* — Muir Patent Law, PLLC

(57)　　　　　ABSTRACT

Provided is an integrated circuit device including a substrate, a plurality of semiconductor patterns on a first surface of the substrate, a gate electrode extending in a first direction and surrounding the semiconductor patterns, a source/drain region disposed on one side of the gate electrode, a vertical power wiring layer extending in a second direction, a liner structure including a first liner and a second liner, the first liner disposed on a lower portion of a sidewall of the vertical power wiring layer and including a first insulating material, and the second liner disposed on an upper portion of the sidewall of the vertical power wiring layer and including a second insulating material, a first contact disposed on the source/drain region and the vertical power wiring layer, and a back wiring structure disposed on a second surface of the substrate and electrically connected to the vertical power wiring layer.

20 Claims, 41 Drawing Sheets

(51) Int. Cl.
  *H10D 62/10*         (2025.01)
  *H10D 84/85*         (2025.01)
  *H10W 20/20*         (2026.01)

(52) U.S. Cl.
  CPC ..... *H10D 30/6735* (2025.01); *H10D 30/6739* (2025.01); *H10D 30/6757* (2025.01); *H10D 62/121* (2025.01); *H10D 84/85* (2025.01)

(58) Field of Classification Search
  CPC ......... H10W 20/42; H10W 20/40–498; H10W 20/031–098; H10D 30/43; H10D 30/6729; H10D 30/6735; H10D 30/6739; H10D 30/6757; H10D 62/121; H10D 84/85; H10D 30/62; H10D 30/501–509; H10D 30/019–0198
  See application file for complete search history.

(56)              References Cited

U.S. PATENT DOCUMENTS

| | | | |
|---|---|---|---|
| 11,121,086 B2 | 9/2021 | Hiblot et al. | |
| 11,121,256 B2 | 9/2021 | Chen et al. | |
| 11,233,005 B1 | 1/2022 | Chen et al. | |
| 11,239,325 B2 | 2/2022 | Huang et al. | |
| 11,264,327 B2 | 3/2022 | Chiang et al. | |
| 11,328,951 B2 | 5/2022 | Morrow et al. | |
| 12,550,370 B2 * | 2/2026 | Chang | H10D 30/6729 |
| 2008/0242084 A1 | 10/2008 | Kim et al. | |
| 2022/0077062 A1 | 3/2022 | Dal et al. | |
| 2022/0157722 A1 | 5/2022 | Bouche et al. | |
| 2023/0420525 A1 * | 12/2023 | Wang | H10D 30/014 |
| 2024/0079316 A1 * | 3/2024 | Xie | H10D 84/0149 |

* cited by examiner

A1–A1'

100

162
FML2 ⎫
FV2 ⎬ FWS
FML1 ⎭
FV1
154 ⎫
152 ⎬ 150
134
150H
128 ⎫
124 ⎬ GS
122 ⎭
NS
112
112T
110
VPT
172F ⎫
172B ⎬ VP
LPT
174F ⎫
174B ⎬ LP
164
BV1 ⎫
BML1 ⎬ BWS
BV2
BML2 ⎭

184 ⎫
180 ⎨
182 ⎩ w11

110F

FA     FA

110B w12

Z
X ⊗ — Y

B1-B1'

B2–B2'

100A

162
FML2 ⎫
FV2  ⎬ FWS
FML1 ⎭
FV1
154 ⎫
152 ⎬ 150
134
150H
128 ⎫
124 ⎬ GS
122 ⎭
NS
112
112T
110
VPT
172F ⎫
172B ⎬ VP
LPT
174F ⎫
174B ⎬ LP
164
BV1  ⎫
BML1 ⎬ BWS
BV2  ⎪
BML2 ⎭

180A { 184
       182

110F

110B

FA        FA w12

Z
X ⊗ → Y

B1−B1'

B2-B2'

B1-B1'

B2-B2'

B2-B2'

184_1  184_2

100C

162
FML2 ⎫
FV2  ⎬ FWS
FML1 ⎭
FV1
154 ⎫
152 ⎬ 150
134
150H
128 ⎫
124 ⎬ GS
122 ⎭
NS
112
112T
110
VPT
172F ⎫
172B ⎬ VP
LPT
174F ⎫ LP
174B ⎭
164
BV1 ⎫
BML1 ⎬ BWS
BV2 ⎪
BML2 ⎭

162
FML2 ⎫
FV2   ⎬ FWS
FML1 ⎭
FV1

134

180 ⎰ 184
    ⎱ 182

144 ⎫
142 ⎬ 140
SD_T
SD_S
132
SD

GCI

FA        FA        112
                    112T
110F                110
                    VPT
                    172F ⎫
                    172B ⎬ VP
                    LPT
110B                174F ⎫
                    174B ⎬ LP
                    164
                    BV1  ⎫
                    BML1 ⎬ BWS
                    BV2  ⎪
                    BML2 ⎭

Z
↑
X ⊗ → Y

B2-B2'

100E

162
FML2 ⎫
FV2  ⎬ FWS
FML1 ⎭
FV1
154 ⎫
152 ⎬ 150
134
150H
128 ⎫
124 ⎬ GS
122 ⎭
NS
112
112T
110
VPT
172F ⎫
172B ⎬ VP
LPT
174F ⎫
174B ⎬ LP
164
BV1  ⎫
BML1 ⎬ BWS
BV2  ⎥
BML2 ⎭

180 ⎧ 184
    ⎩ 182
GCI
110F
110B
FA
FA

Z
X ⊗ → Y

B1-B1'

B2–B2'

A1–A1'

100F

162
FML2 ⎫
FV2  ⎬ FWS
FML1 ⎭
FV1
154 ⎫
152 ⎬ 150
134
150H
128 ⎫
124 ⎬ GS
122 ⎭
NS
112
112T
110
VPT
172F ⎫
172B ⎬ VP
LPT
174F ⎫
174B ⎬ LP
164
BV1  ⎫
BML1 ⎬ BWS
BV2  ⎪
BML2 ⎭

136
180 { 184
      182
110F
110B

FA    FA

Z
↑
X ⊗ → Y

B1−B1'

B2–B2'

A1-A1'

A1–A1'

B1–B1'

A1–A1'

B1–B1'

SD_T

SD_S

132

SD

RS

FA

FA

112

110F

112T

110

110B

B2–B2'

A1-A1'

B1–B1'

B1−B1'

134
184
182

220
SD_T
SD_S
132
SD 112
112T
110
VPT

FA　　　FA

110F

110B

Z
X ⊗ → Y

B2-B2'

134

180 { 184
      182

SD_T

SD_S

132

SD

112

112T

110

VPT

172F } VP

172B

110F

110B

FA     FA

B1-B1'

B2-B2'

B1−B1'

B2–B2'

B1-B1'

B2-B2'

B2–B2'

1

INTEGRATED CIRCUIT DEVICES

CROSS-REFERENCE TO RELATED APPLICATION

This application is based on and claims priority under 35 U.S.C. § 119 to Korean Patent Application No. 10-2022-0132726, filed on Oct. 14, 2022, in the Korean Intellectual Property Office, the disclosure of which is incorporated by reference herein in its entirety.

BACKGROUND

The inventive concept relates to an integrated circuit device, and more particularly, to an integrated circuit device including a field-effect transistor.

As miniaturization, multi-functionality, and high performance are demanded for electronic devices, high-capacity integrated circuit devices are needed, an increased degree of integration is demanded to provide high-capacity integrated circuit devices. For example, small-sized field-effect transistors may reduce the area of an integrated circuit, but the operation speed of the integrated circuit is deteriorated due to the complexity of wiring structures for small-sized devices. Therefore, it may be important to design an integrated circuit device in consideration of the degree of integration and performance in order to achieve the functions and operating speed required for an integrated circuit device.

SUMMARY

The inventive concept provides an integrated circuit device including a field effect transistor with improved integration and electrical performance.

According to an aspect of the inventive concept, there is provided an integrated circuit device including a substrate having a first surface and a second surface opposite to the first surface, a plurality of semiconductor patterns spaced apart from one another in a vertical direction on the first surface of the substrate, a gate electrode extending in a first horizontal direction and surrounding the plurality of semiconductor patterns, a source/drain region disposed on one side of the gate electrode and connected to the plurality of semiconductor patterns, a vertical power wiring layer spaced apart from the source/drain regions in the first horizontal direction and extending in a second horizontal direction, a liner structure disposed on a sidewall of the vertical power wiring layer and including a first liner and a second liner, the first liner being disposed on a lower portion of the sidewall of the vertical power wiring layer and including a first insulating material, and the second liner being disposed on an upper portion of the sidewall of the vertical power wiring layer and including a second insulating material different from the first insulating material, a first contact disposed on a top surface of the source/drain region and a top surface of the vertical power wiring layer, and a back wiring structure disposed on the second surface of the substrate and electrically connected to the vertical power wiring layer.

According to another aspect of the inventive concept, there is provided an integrated circuit device including a substrate having a first surface and a second surface opposite to the first surface, an active region disposed on the first surface of the substrate, a gate electrode disposed on the active region and extending in a first horizontal direction, a source/drain region disposed on one side of the gate electrode, an inter-gate insulation layer covering sidewalls of the gate electrode and the source/drain region on the first surface of the substrate, a liner structure disposed on a sidewall of a vertical power trench that extends into the substrate through the inter-gate insulation layer, the liner structure including a first liner and a second liner, wherein the first liner is disposed on a lower portion of the sidewall of the vertical power trench and the second liner is disposed on an upper portion of the sidewall of the vertical power trench, a vertical power wiring layer disposed in the vertical power trench, with both sidewalls of the vertical power wiring layer being covered by the liner structure, a first contact disposed on a top surface of the source/drain region and a top surface of the vertical power wiring layer, and a back wiring structure disposed on the second surface of the substrate and electrically connected to the vertical power wiring layer.

According to another aspect of the inventive concept, there is provided an integrated circuit device including a substrate including a first surface and a second surface, a plurality of logic cells arranged on the first surface of the substrate, and a back wiring structure disposed on the second surface of the substrate and configured to supply power to the plurality of logic cells, wherein each of the plurality of logic cells includes a plurality of semiconductor patterns spaced apart from one another in a vertical direction on the first surface of the substrate, a gate electrode extending in a first horizontal direction and surrounding the plurality of semiconductor patterns, a source/drain region disposed on one side of the gate electrode and connected to the plurality of semiconductor patterns, an inter-gate insulation layer covering sidewalls of the gate electrode and the source/drain region on the first surface of the substrate, a liner structure disposed on a sidewall of a vertical power trench that extends into the substrate through the inter-gate insulation layer, the liner structure including a first liner and a second liner, wherein the first liner is disposed on a lower portion of the sidewall of the vertical power trench and the second liner is disposed on an upper portion of the sidewall of the vertical power trench, a vertical power wiring layer disposed in the vertical power trench, with both sidewalls of the vertical power wiring layer being covered by the liner structure, and a first contact disposed on a top surface of the source/drain region and a top surface of the vertical power wiring layer, a top surface of the first liner is disposed at a higher vertical level than a top surface of the gate electrode, and the first liner includes silicon nitride and the second liner includes silicon oxide.

BRIEF DESCRIPTION OF THE DRAWINGS

Embodiments of the inventive concept will be more clearly understood from the following detailed description taken in conjunction with the accompanying drawings in which like numerals refer to like elements throughout. In the drawings.

US 12,696,751 B2

3

Figure 2:
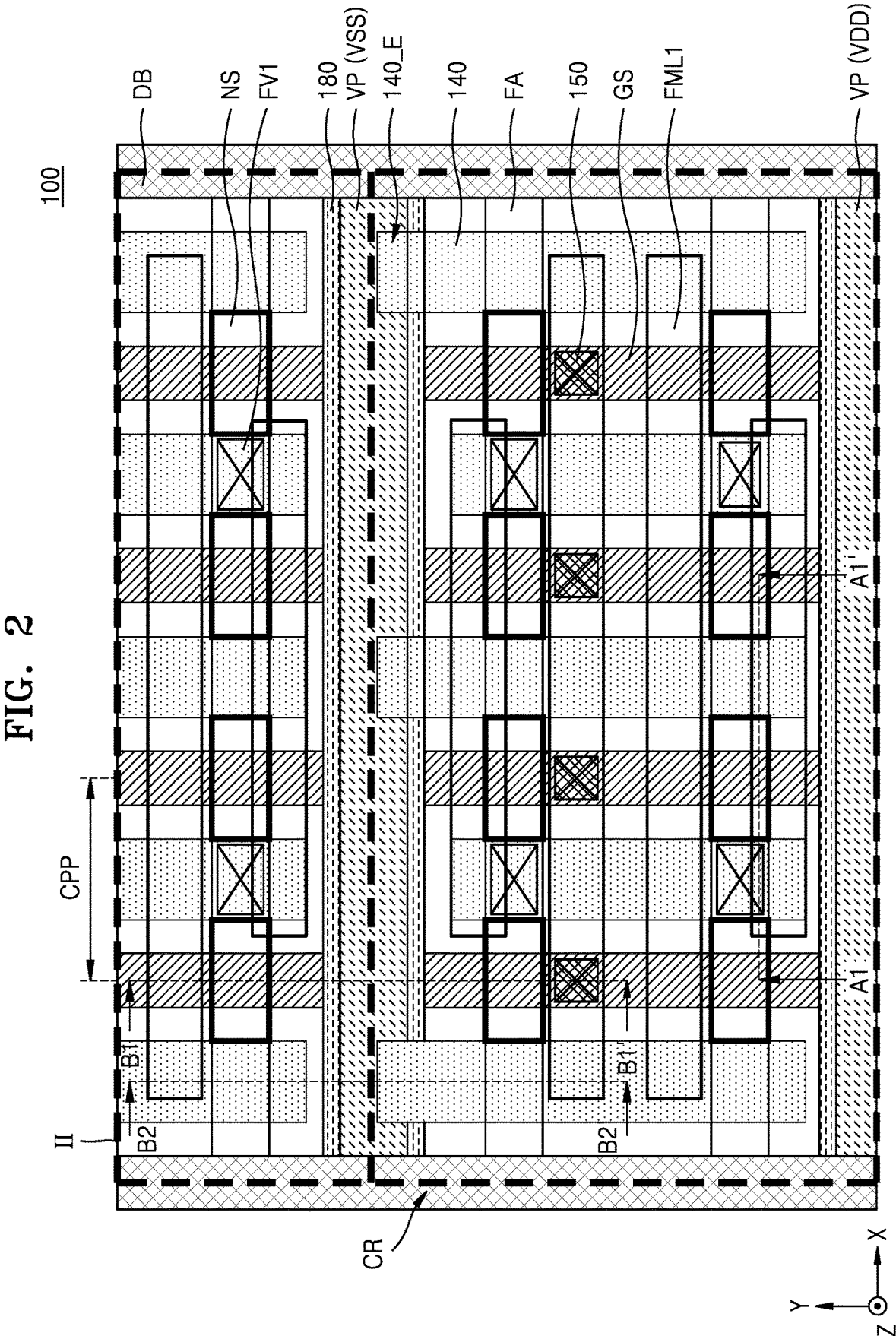
FIG. 2 is an enlarged layout view of a portion II of FIG. 1.
Figure 8:
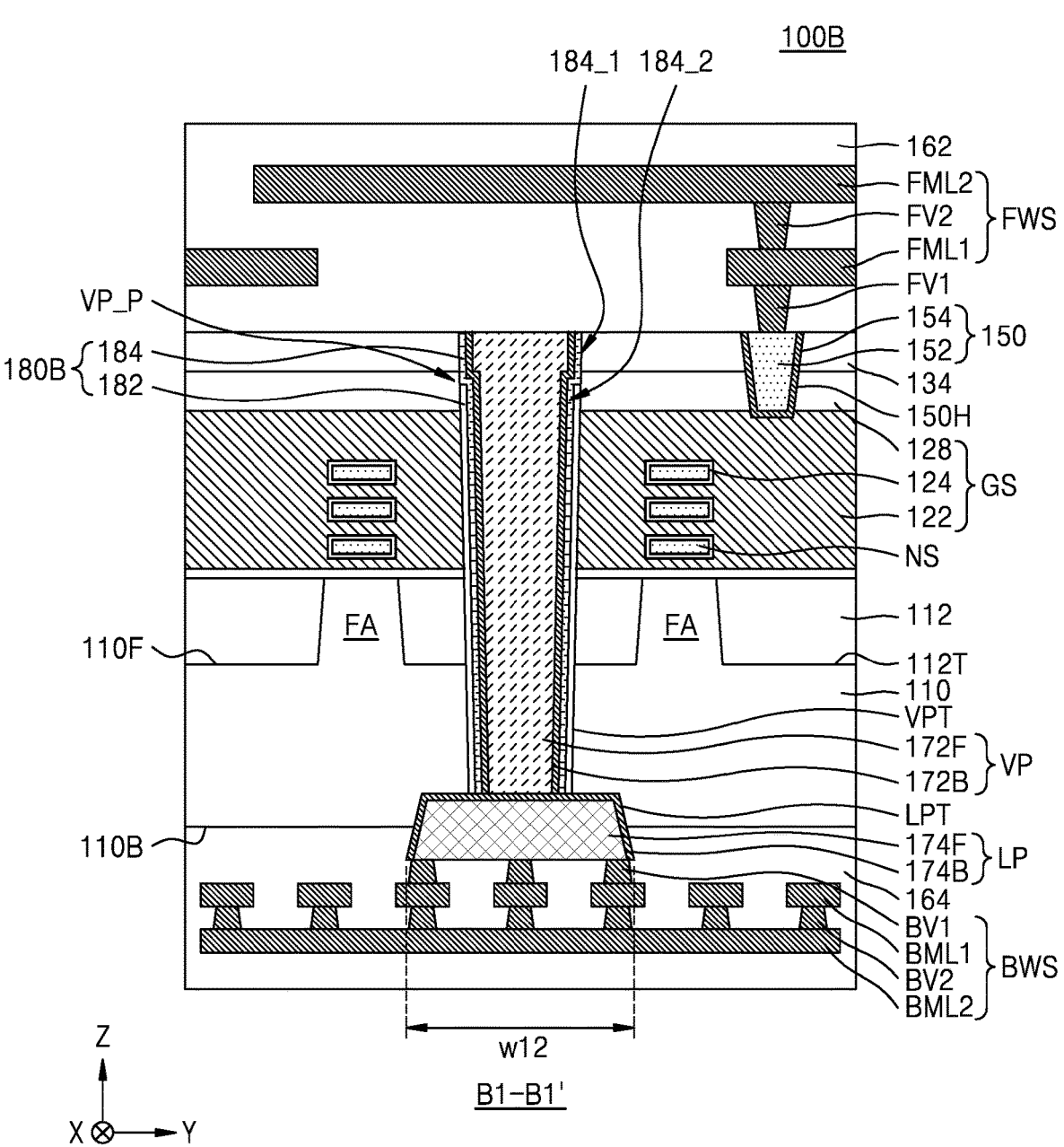
Figure 9:
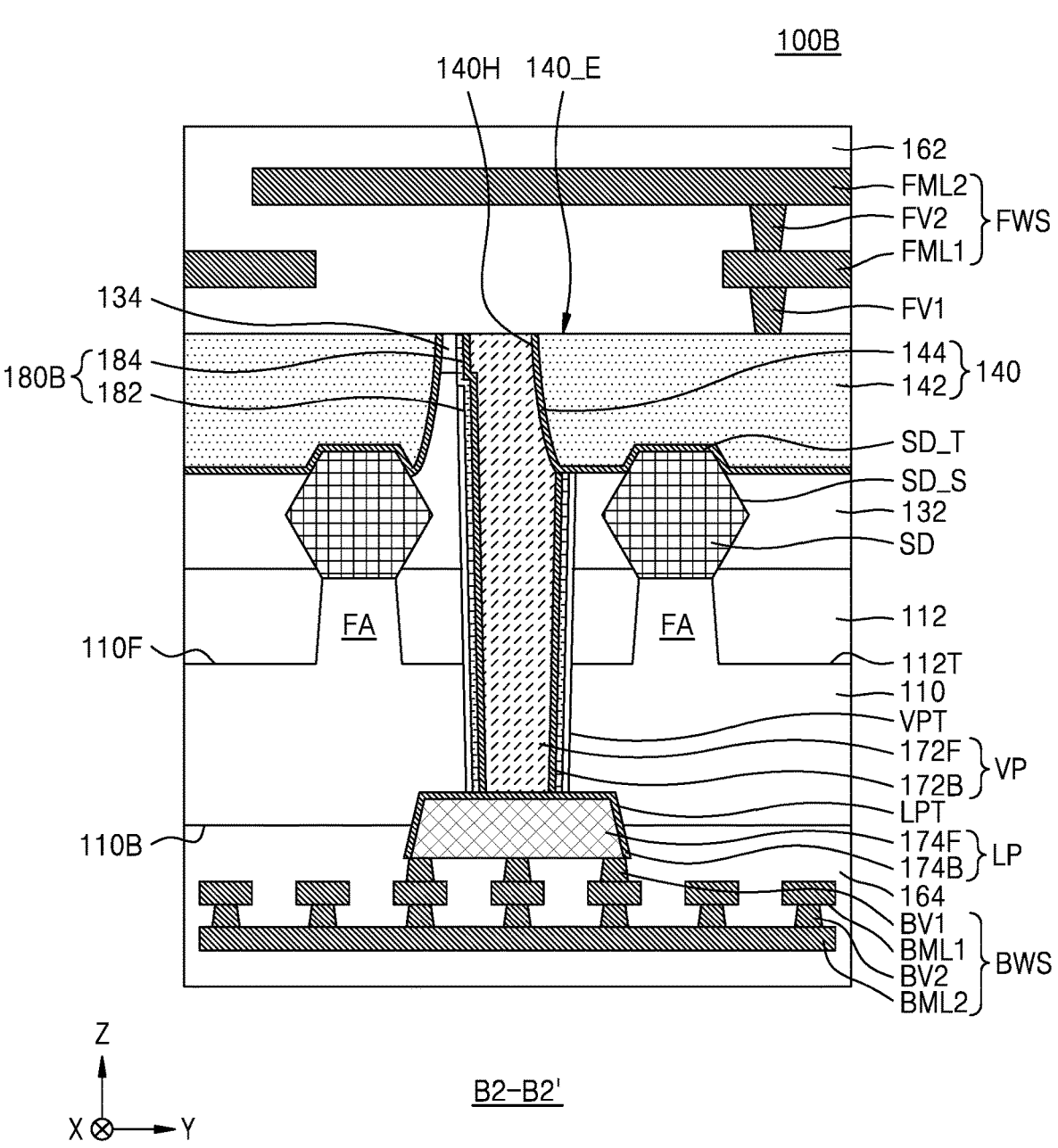
Figure 10:
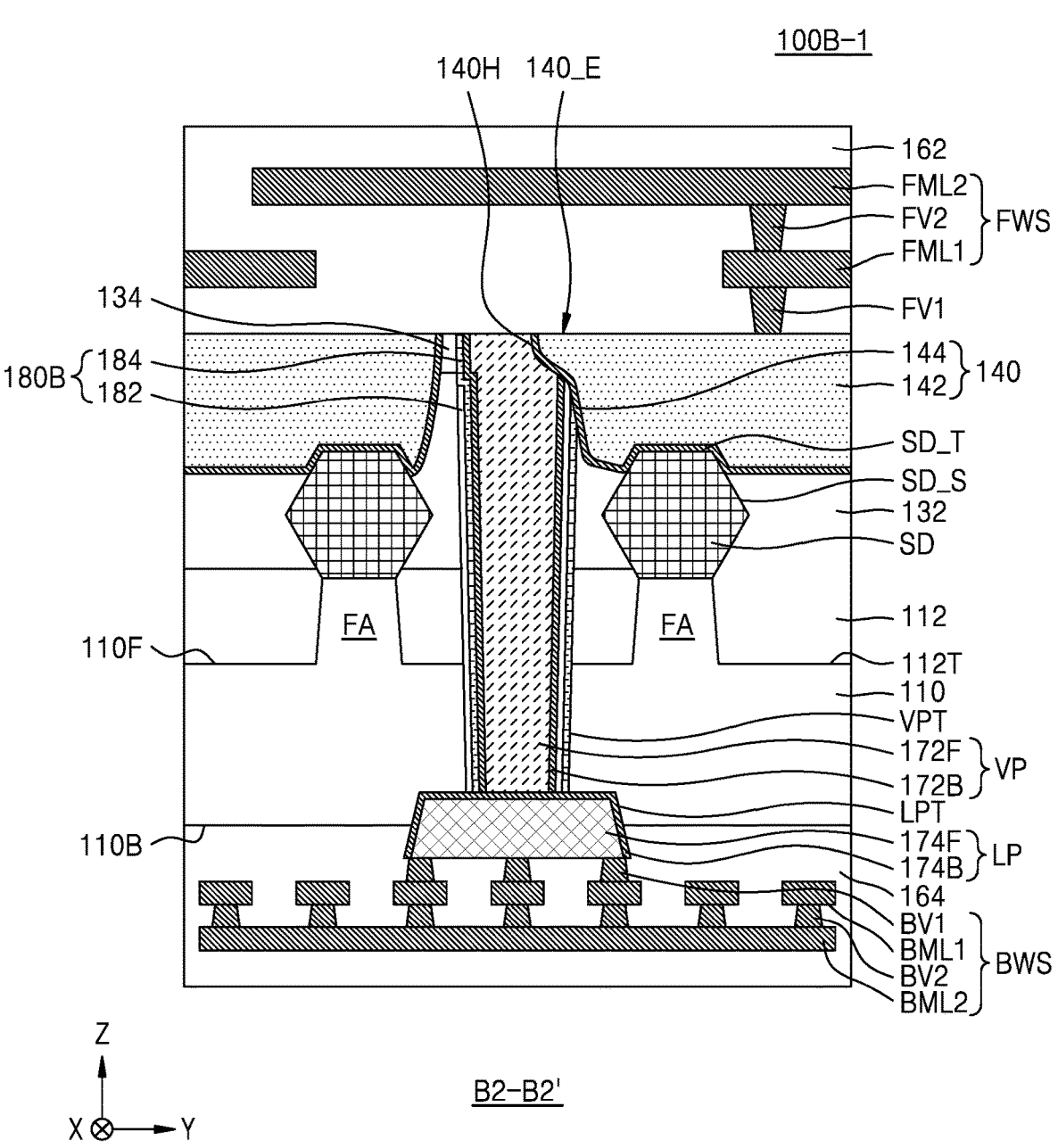
Figure 11:
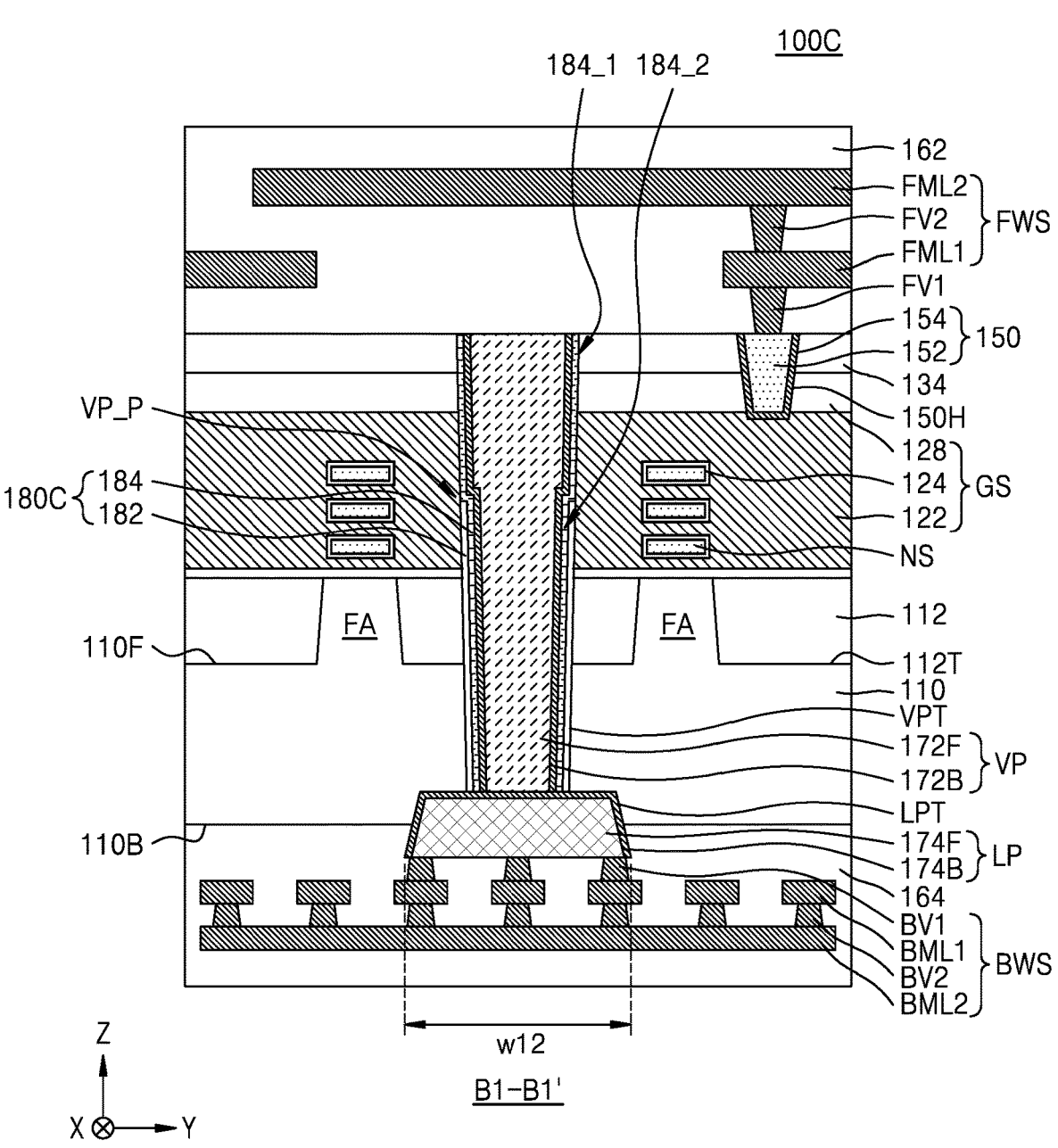
Figure 12:
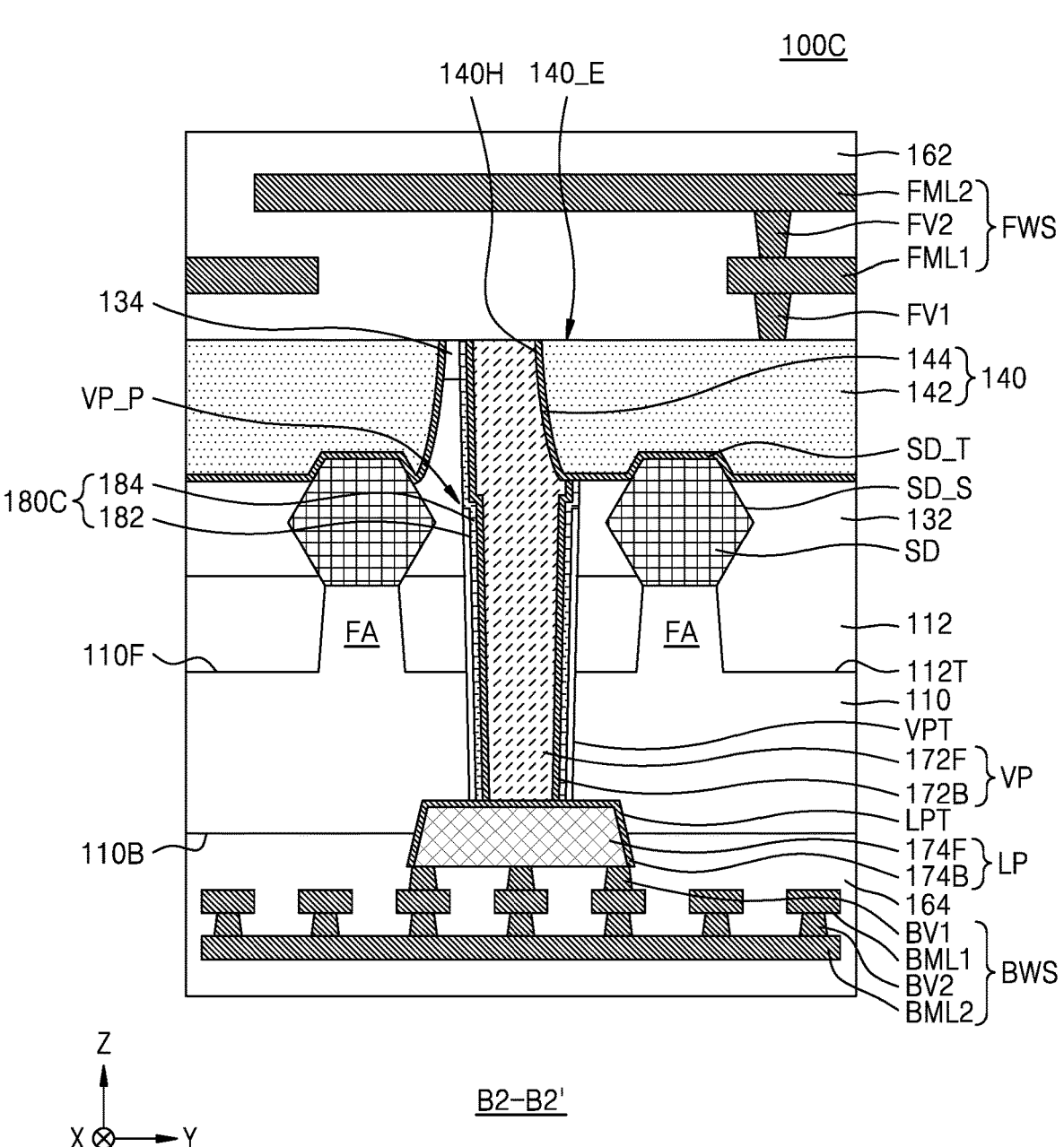
Figure 14:
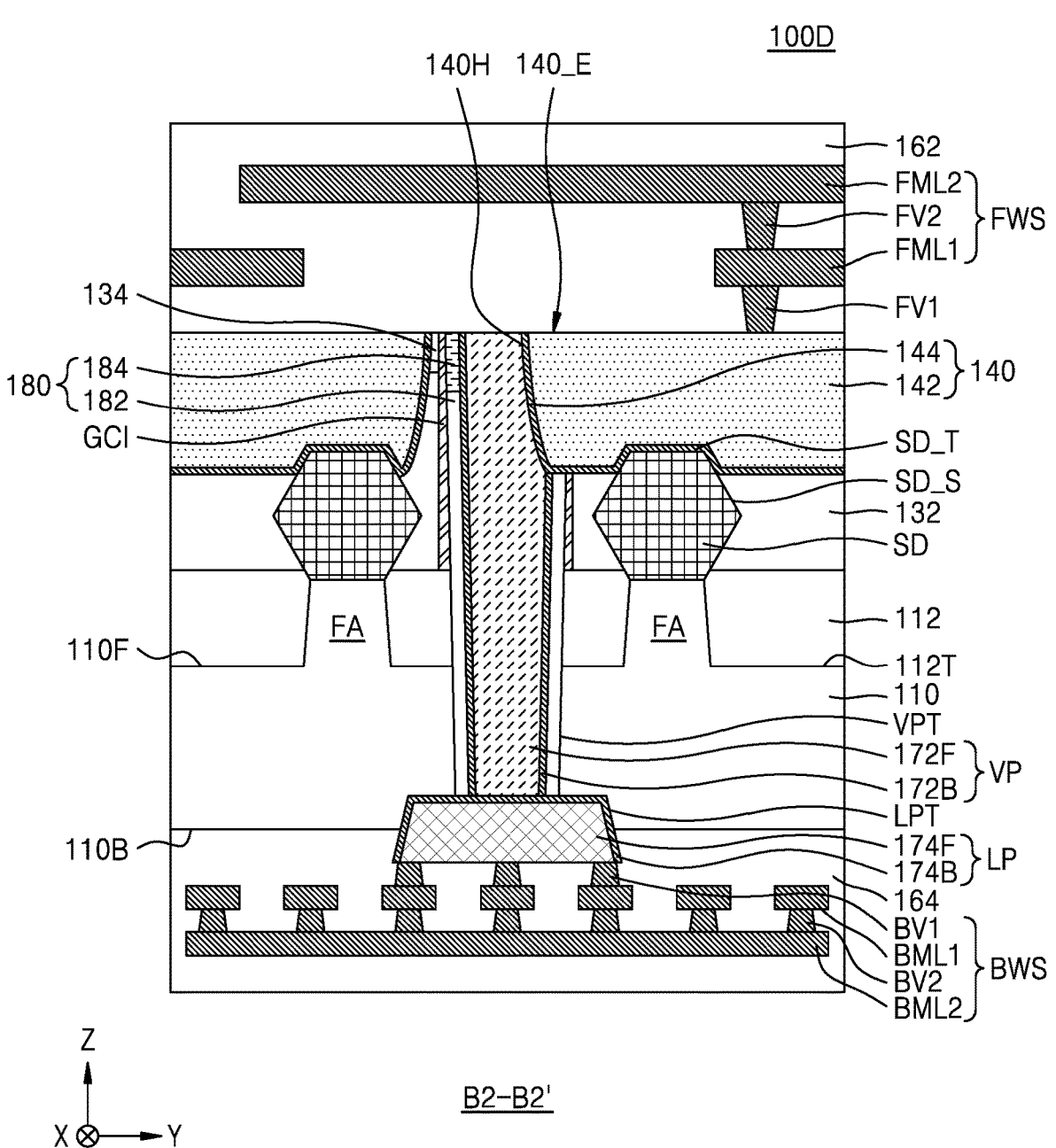
Figure 15:
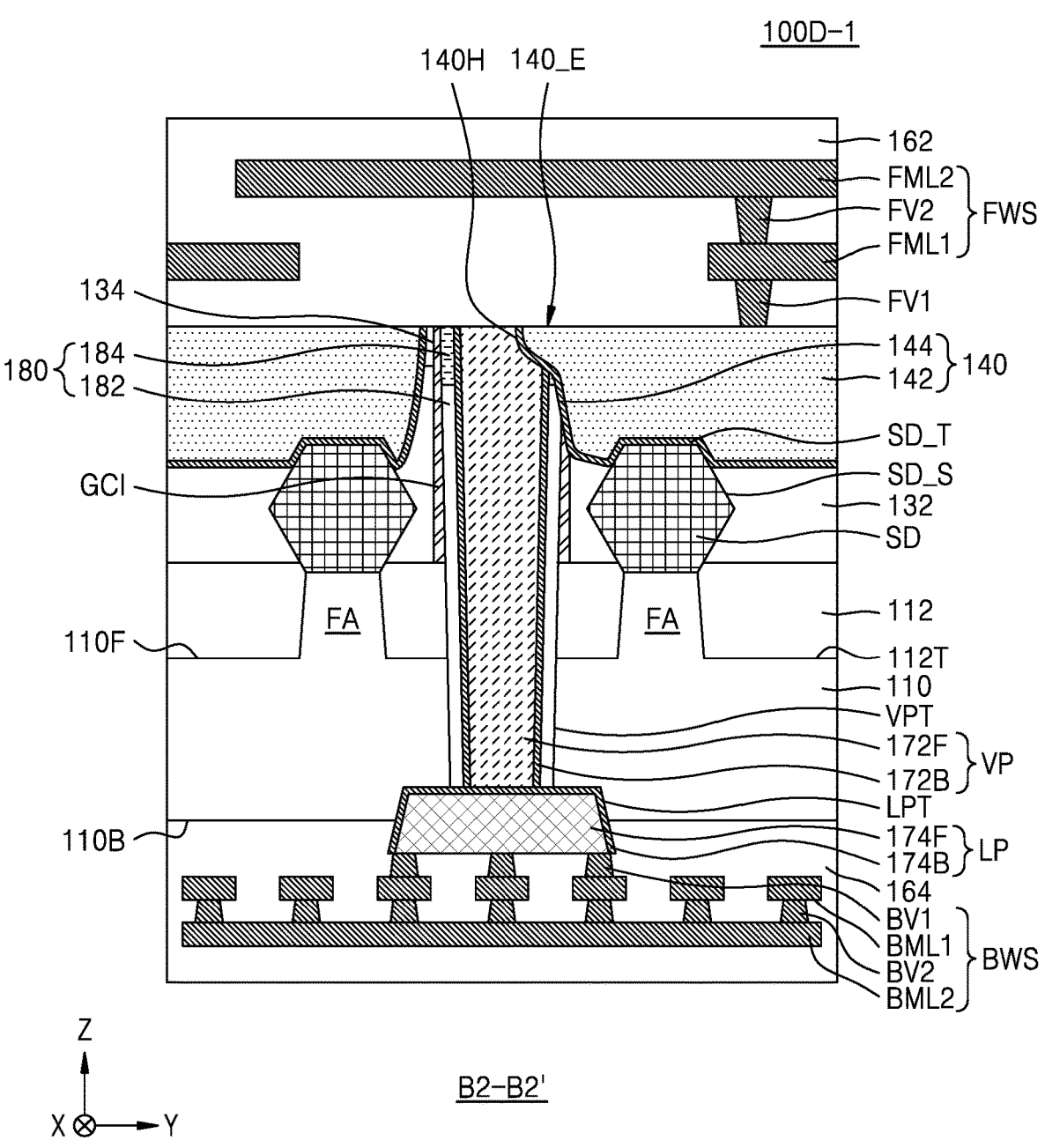
Figure 16:
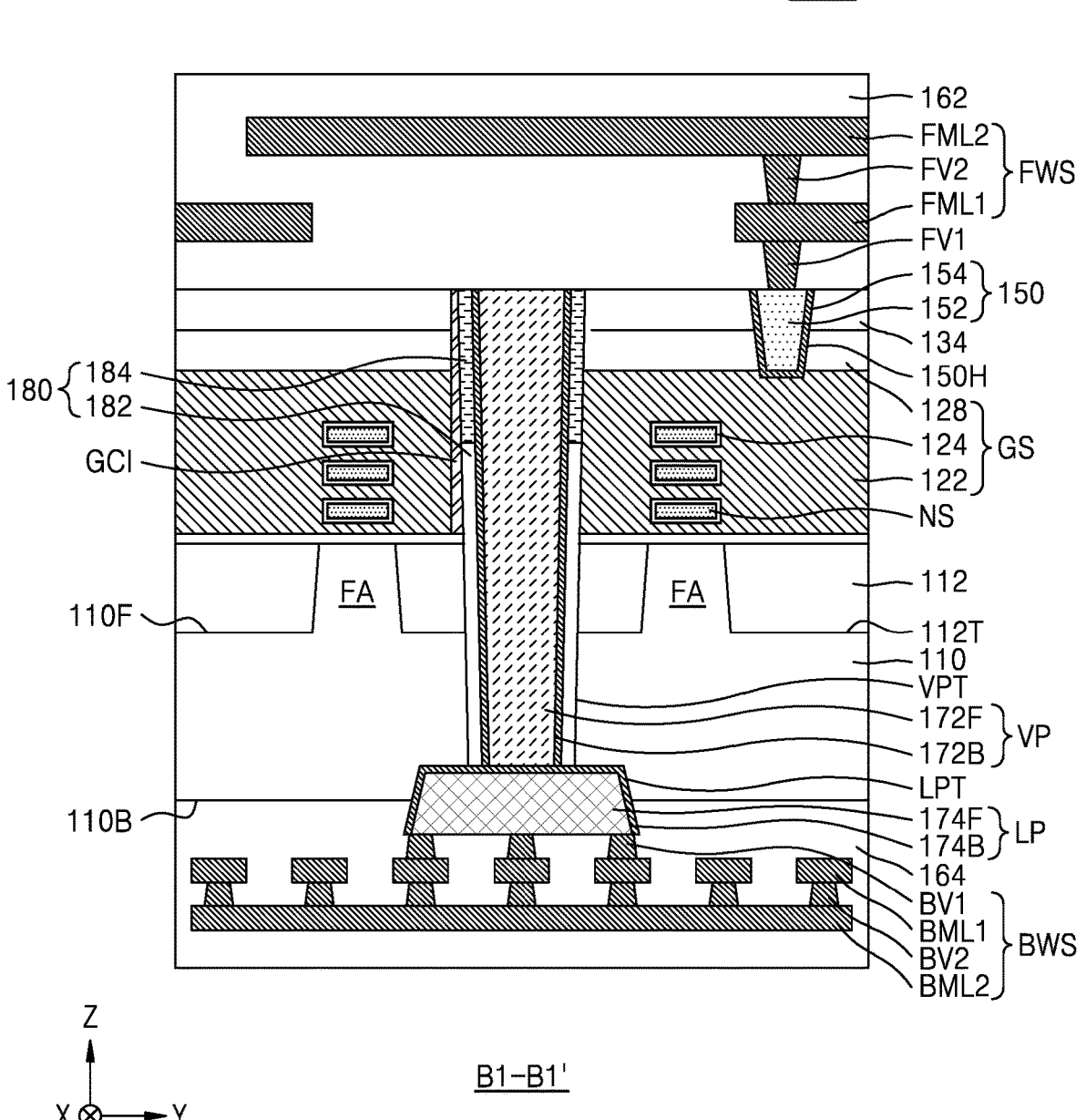
Figure 17:
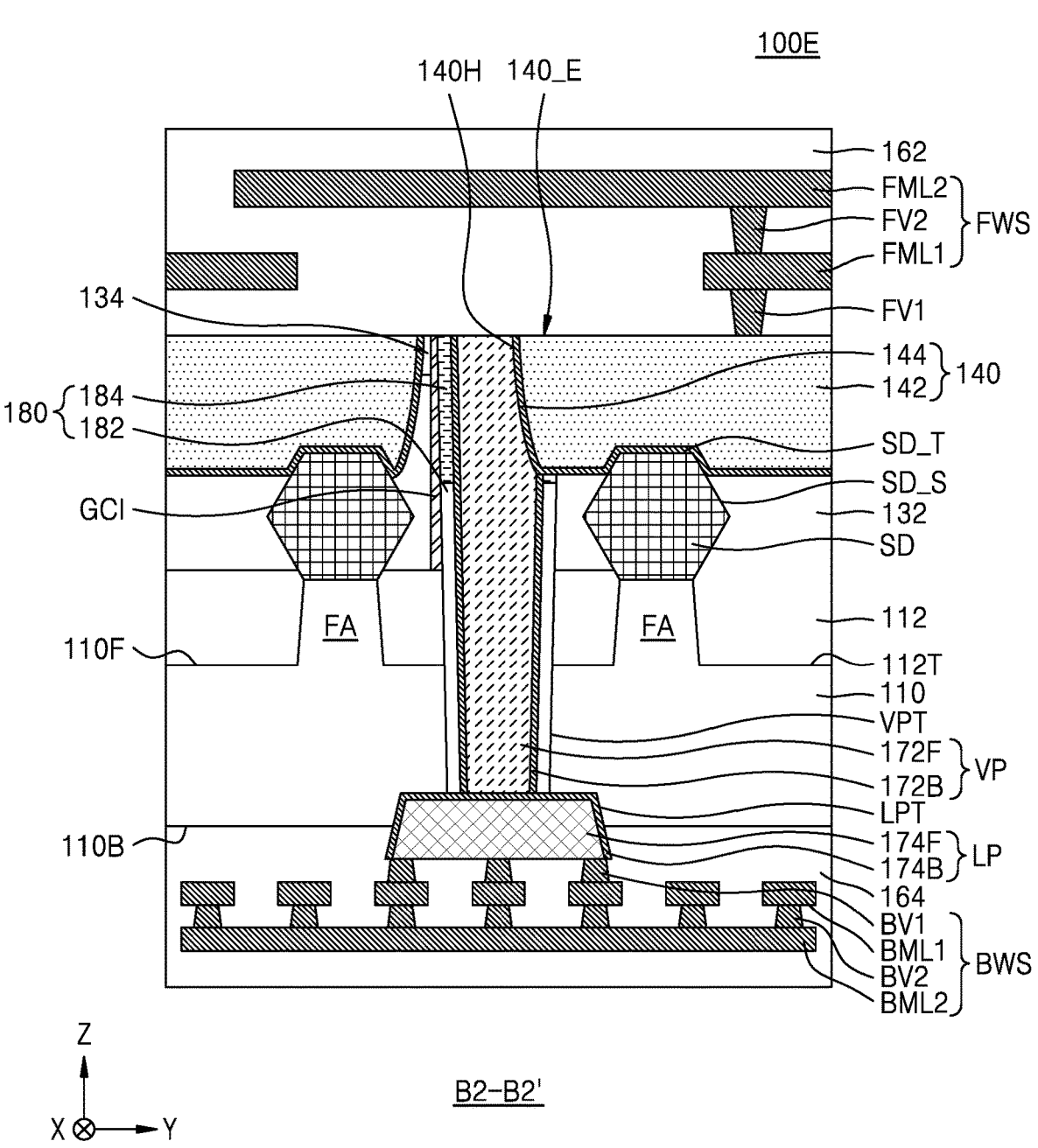
Figure 18:
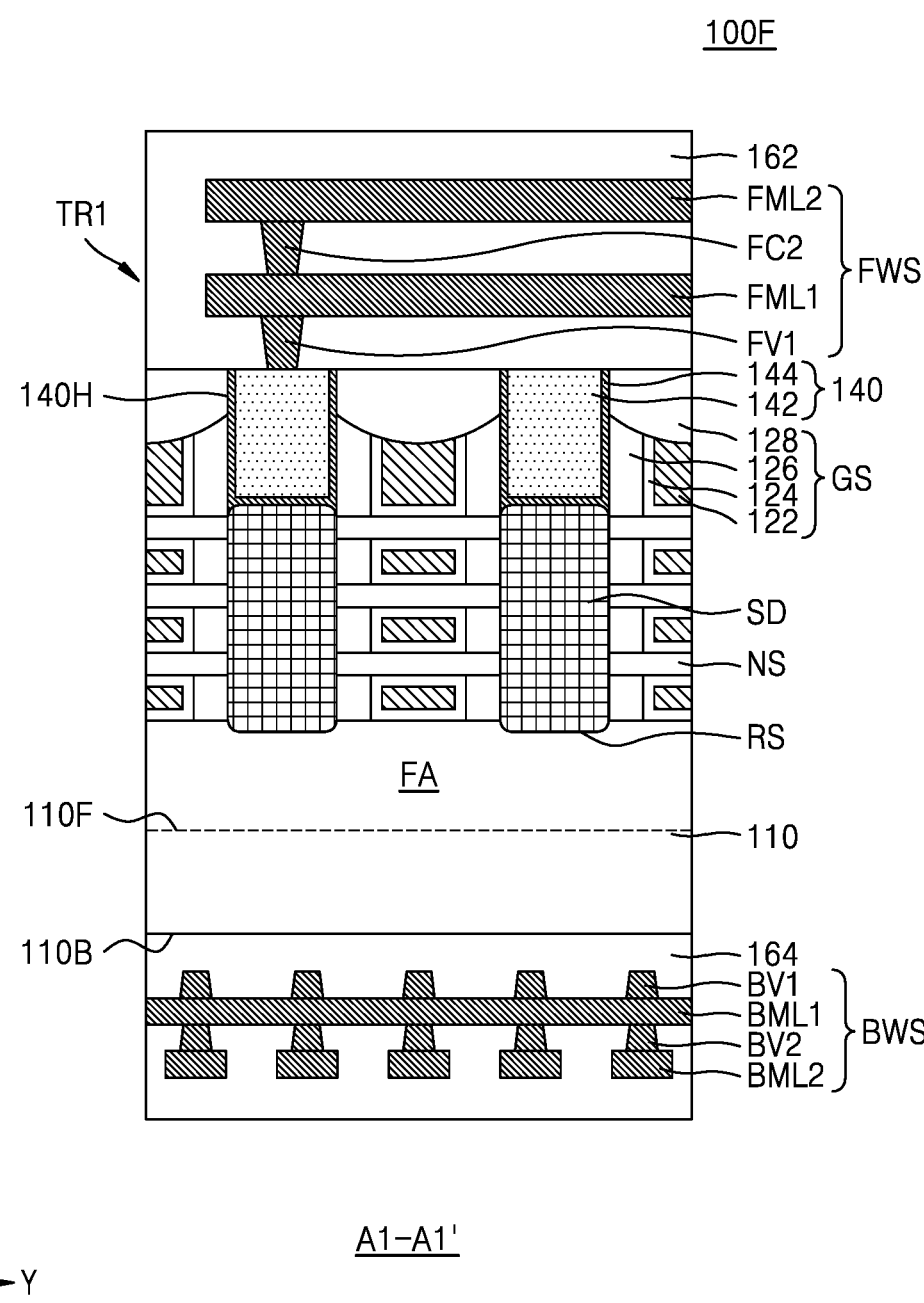
Figure 19:
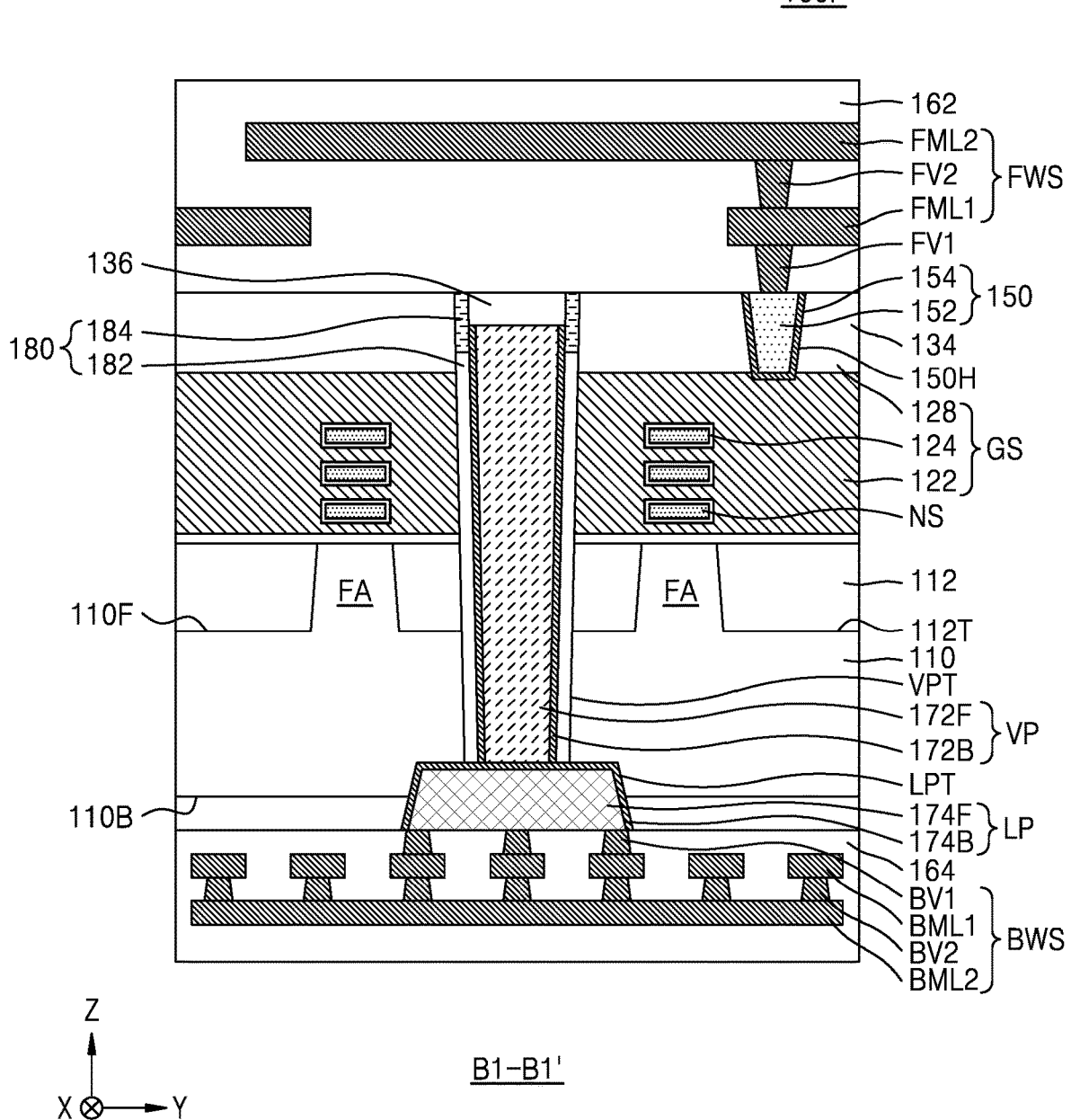
Figure 20:
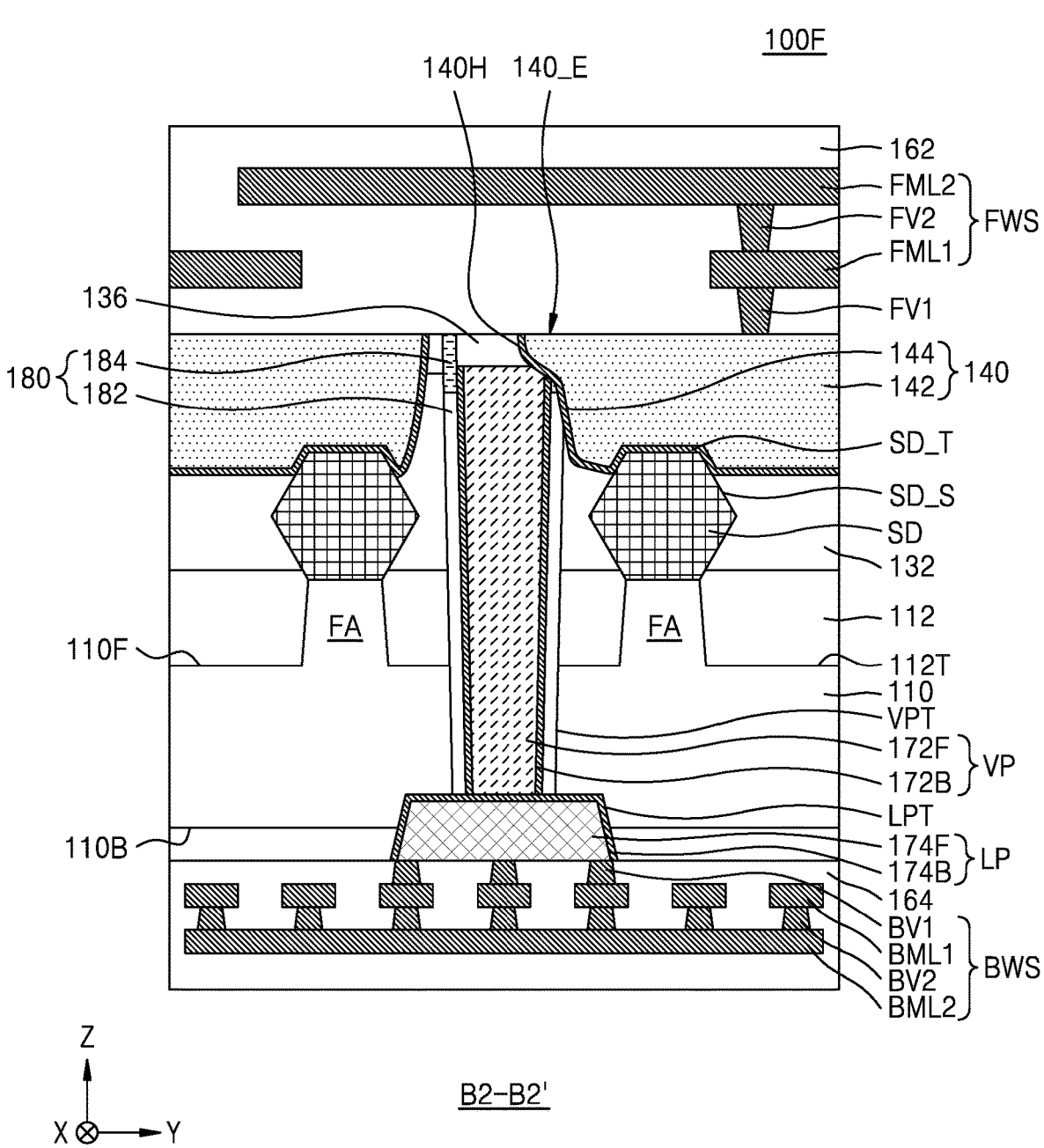
Figure 21:
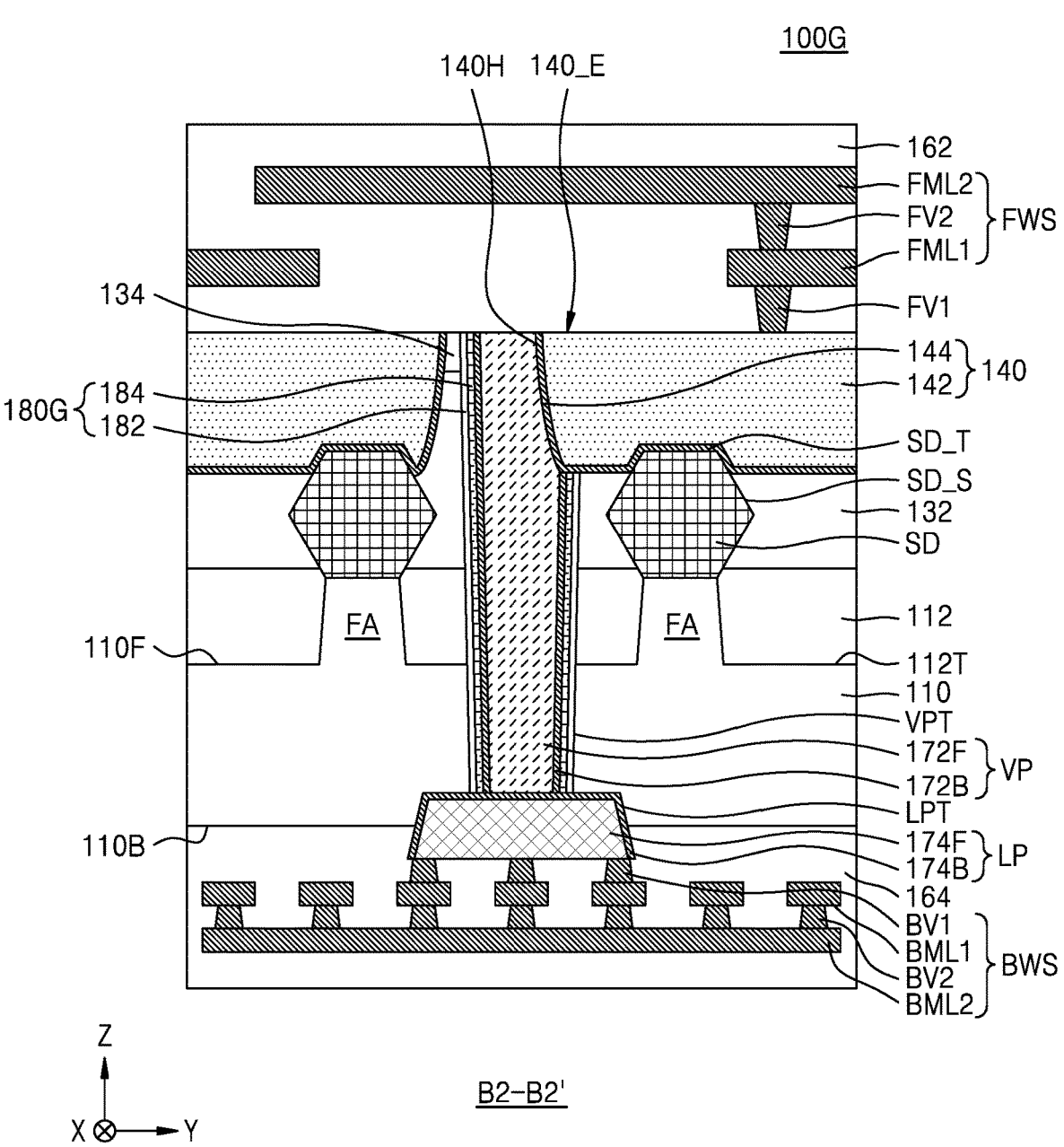
Figure 22:
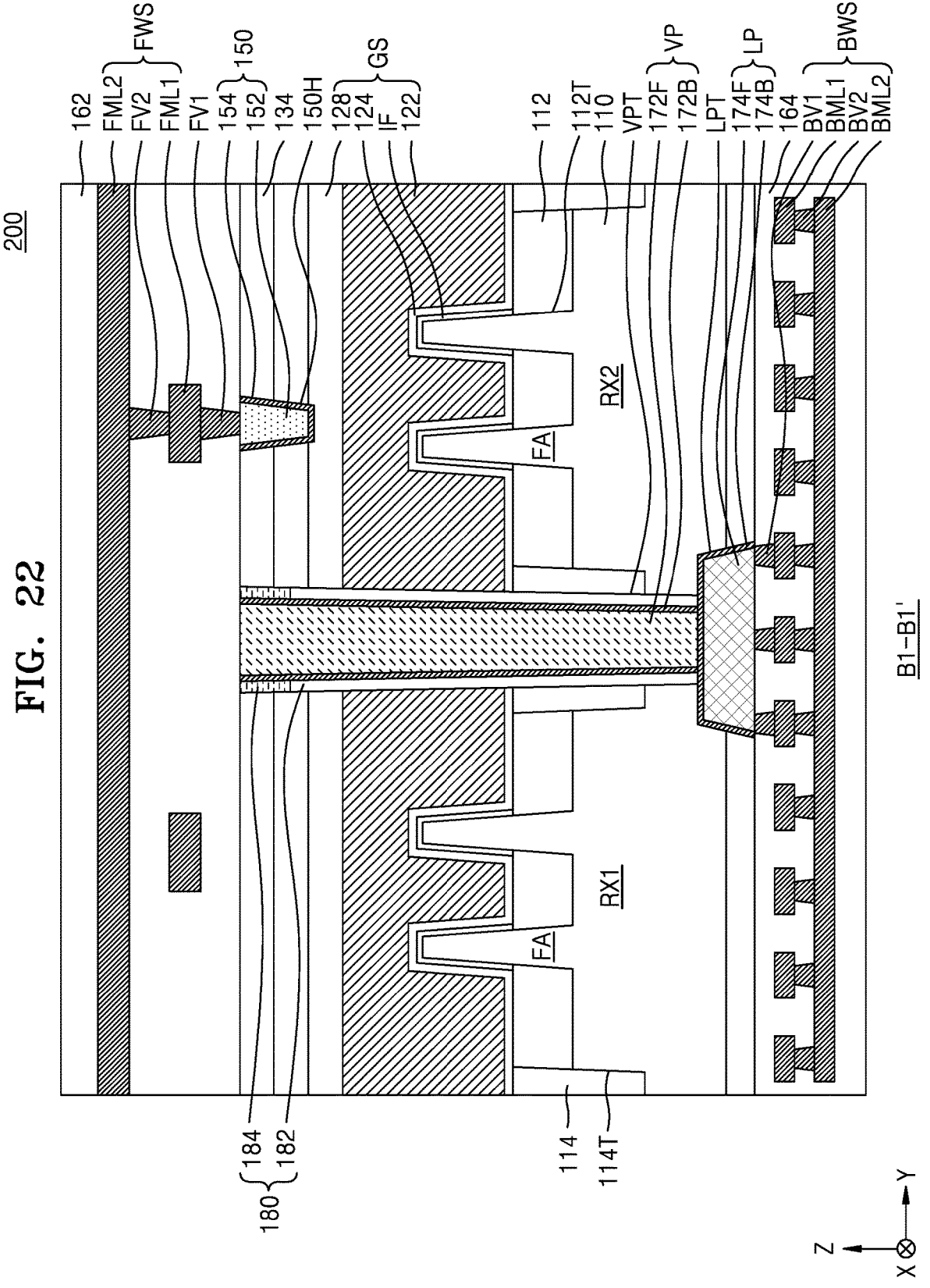
Figure 32:
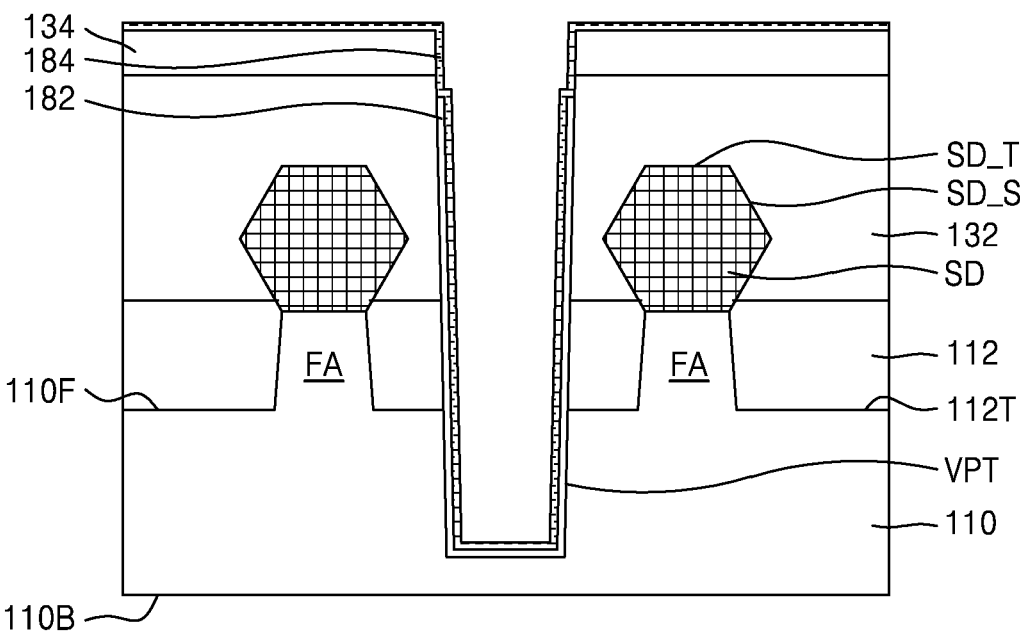
Figure 32:
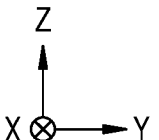
Figure 33:
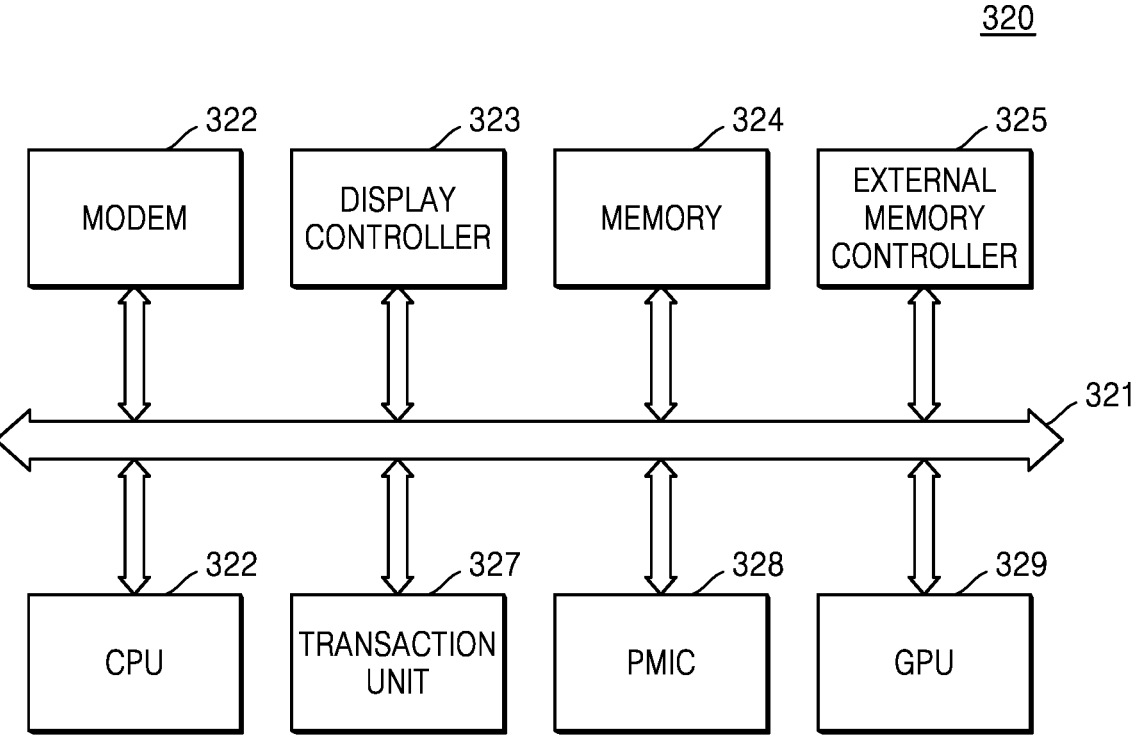
Figure 34:
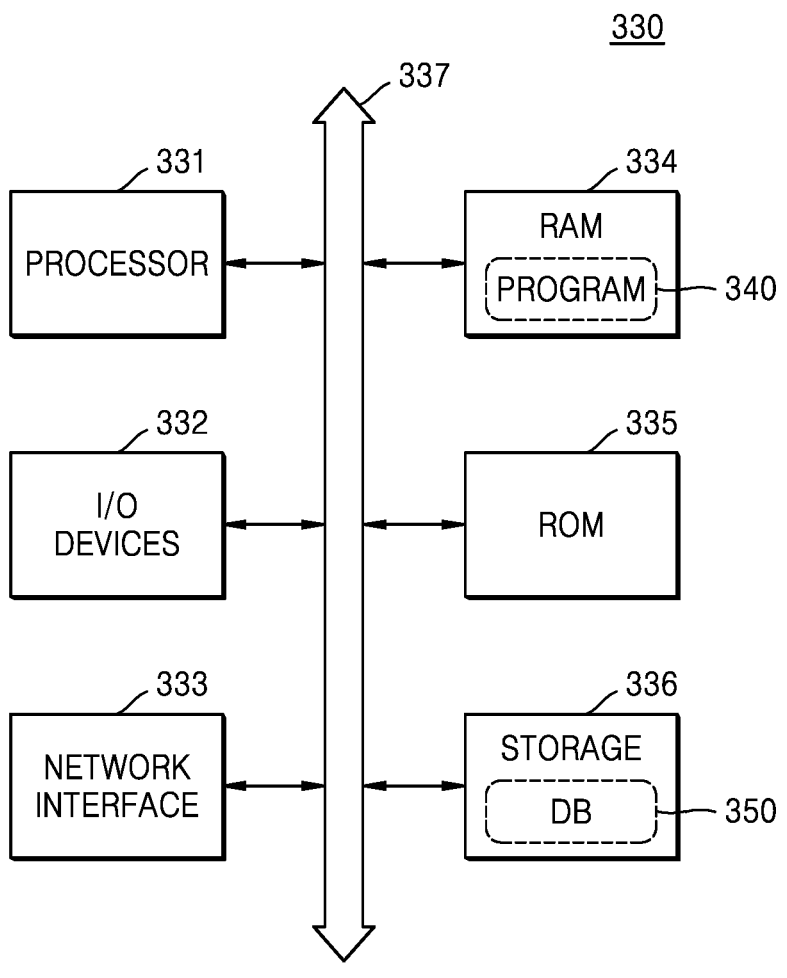

FIGS. 8 and 9 are cross-sectional views of an integrated circuit device according to example embodiments;

FIG. 10 is a cross-sectional view of an integrated circuit device according to example embodiments;

FIGS. 11 and 12 are cross-sectional views of an integrated circuit device according to example embodiments;

Figure 13:
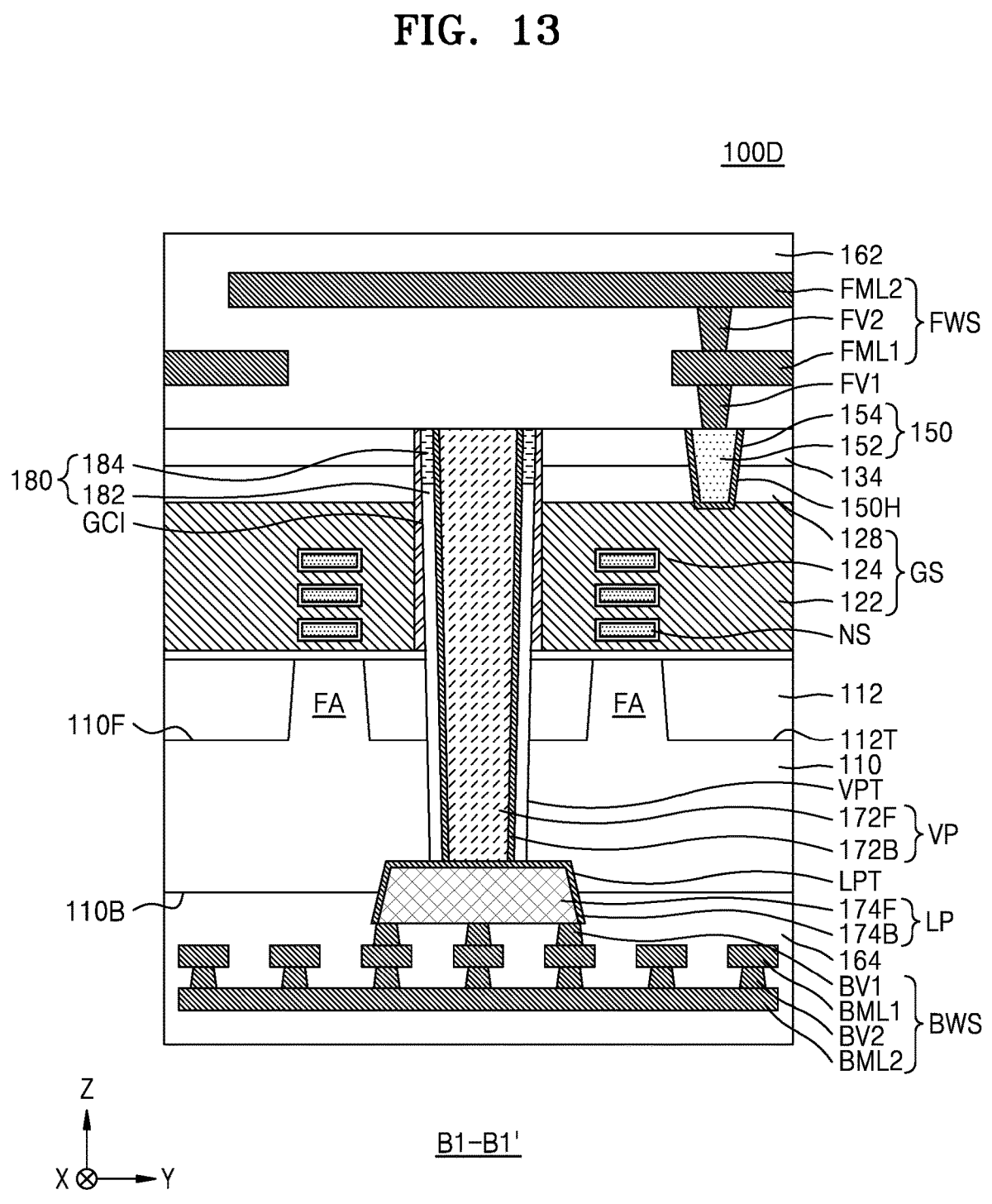

FIGS. 13 and 14 are cross-sectional views of an integrated circuit device according to example embodiments;

FIG. 15 is a cross-sectional view of an integrated circuit device according to example embodiments;

FIGS. 16 and 17 are cross-sectional views of an integrated circuit device according to example embodiments;

FIGS. 18 to 20 are cross-sectional views of an integrated circuit device according to example embodiments;

FIG. 21 is a cross-sectional view of an integrated circuit device according to example embodiments;

FIG. 22 is a cross-sectional view of an integrated circuit device according to example embodiments;

FIGS. 23 to 31B are cross-sectional views of a method of manufacturing an integrated circuit device according to example embodiments, wherein, in detail, FIGS. 23, 24A, 25A, and 26A are cross-sectional views corresponding to a cross-section taken along a line A1-A1' of FIG. 2, FIGS. 24B, 25B, 26B, 27A, 30A, and 31A are cross-sectional views corresponding to a cross-section taken along a line B1-B1' of FIG. 2, and FIGS. 25C, 27B, 28, 29, 30B, and 31B are cross-sectional views corresponding to a cross-section taken along a line B2-B2' of FIG. 2;

FIG. 32 is a cross-sectional view showing a method of manufacturing an integrated circuit device according to example embodiments;

FIG. 33 is a block diagram showing a system-on-chip (SoC) according to an example embodiment; and FIG. 34 is a block diagram showing a computing system including a memory for storing a program according to an example embodiment.

DETAILED DESCRIPTION OF THE EMBODIMENTS

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element for using any form of the word "contact"), there are no intervening elements present at the point of contact.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise.

Figure 1:
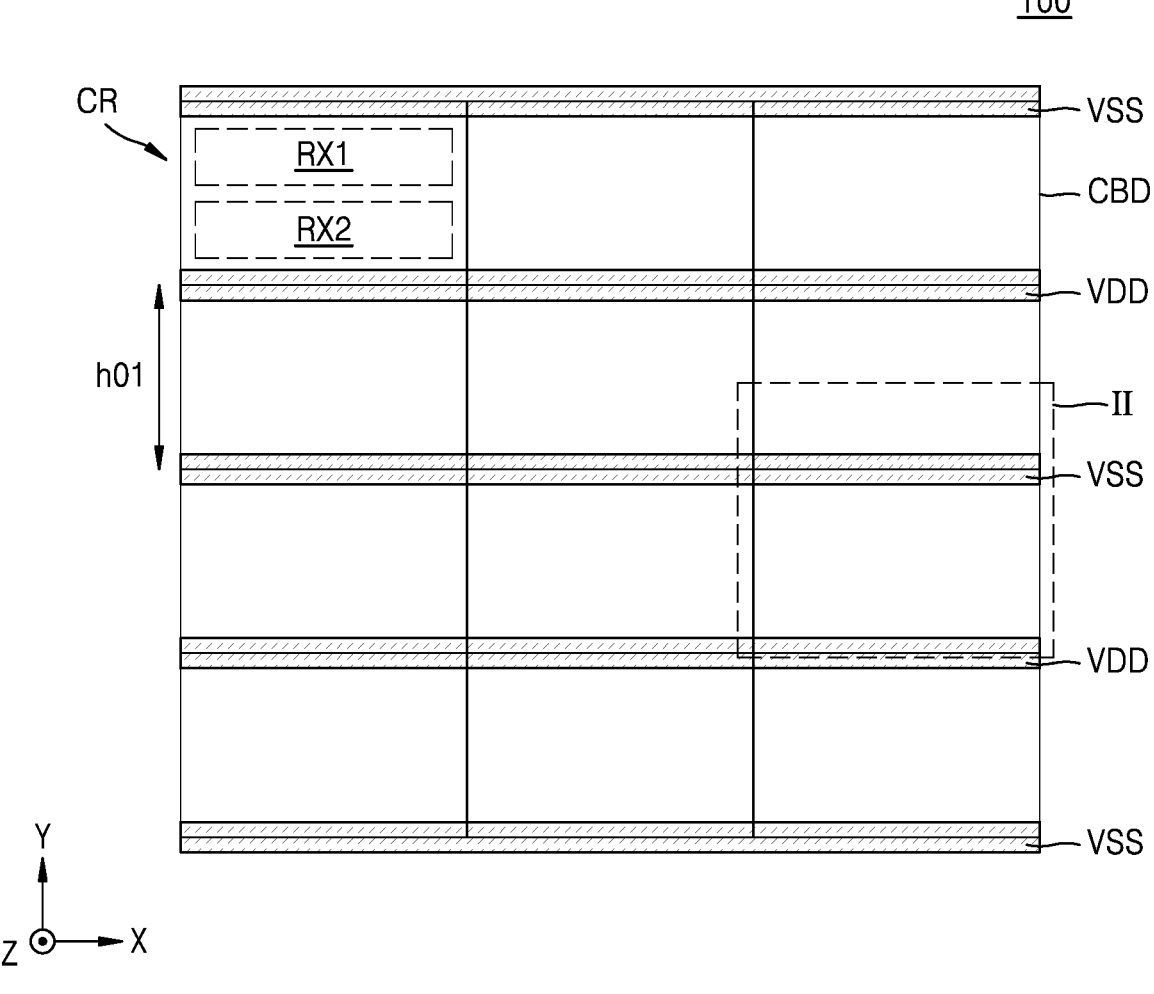
FIG. 1 is a schematic layout diagram showing an integrated circuit device according to example embodiments.
Figure 3:
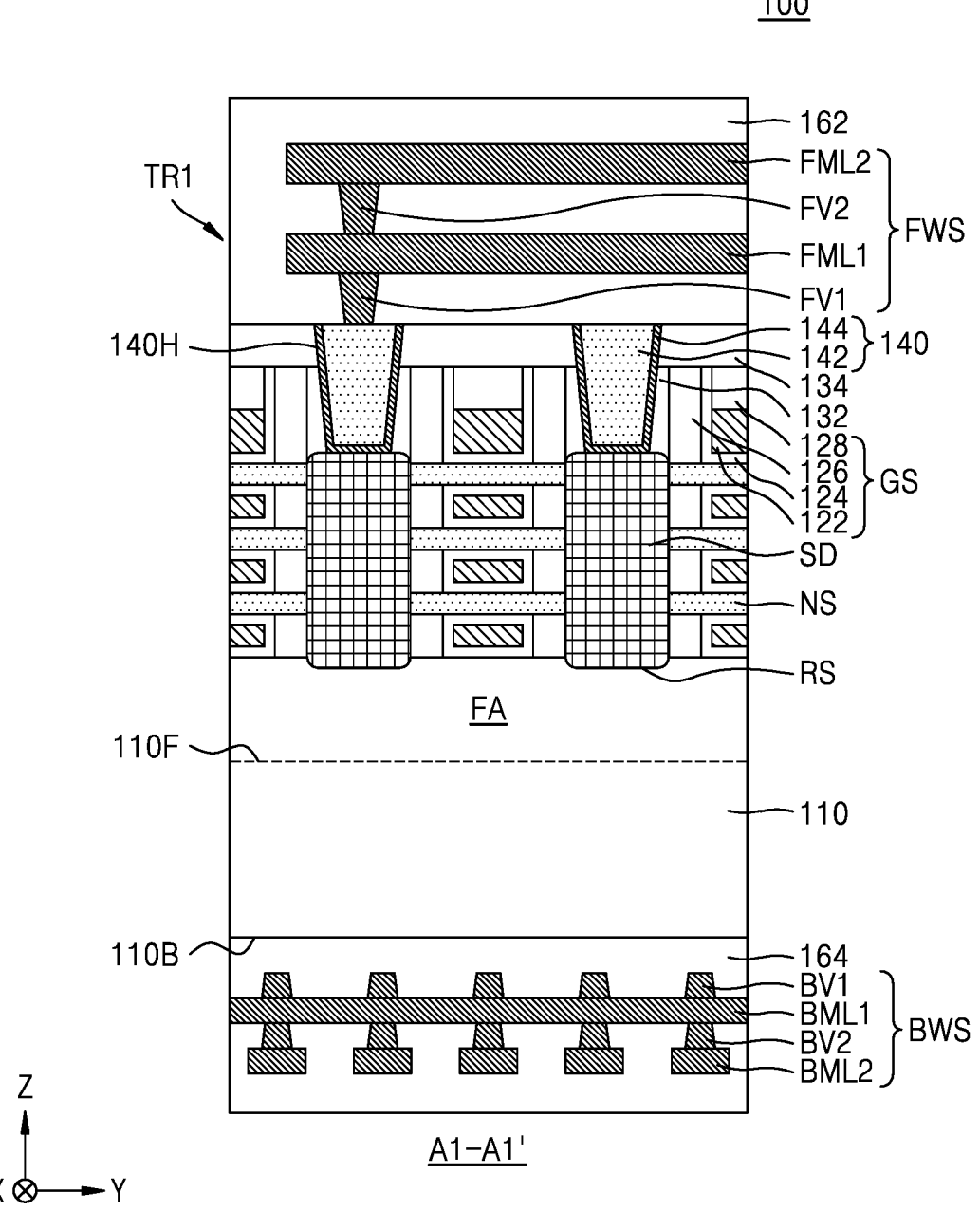
FIG. 3 is a cross-sectional view taken along a line A1-A1' of FIG. 2.
Figure 4:
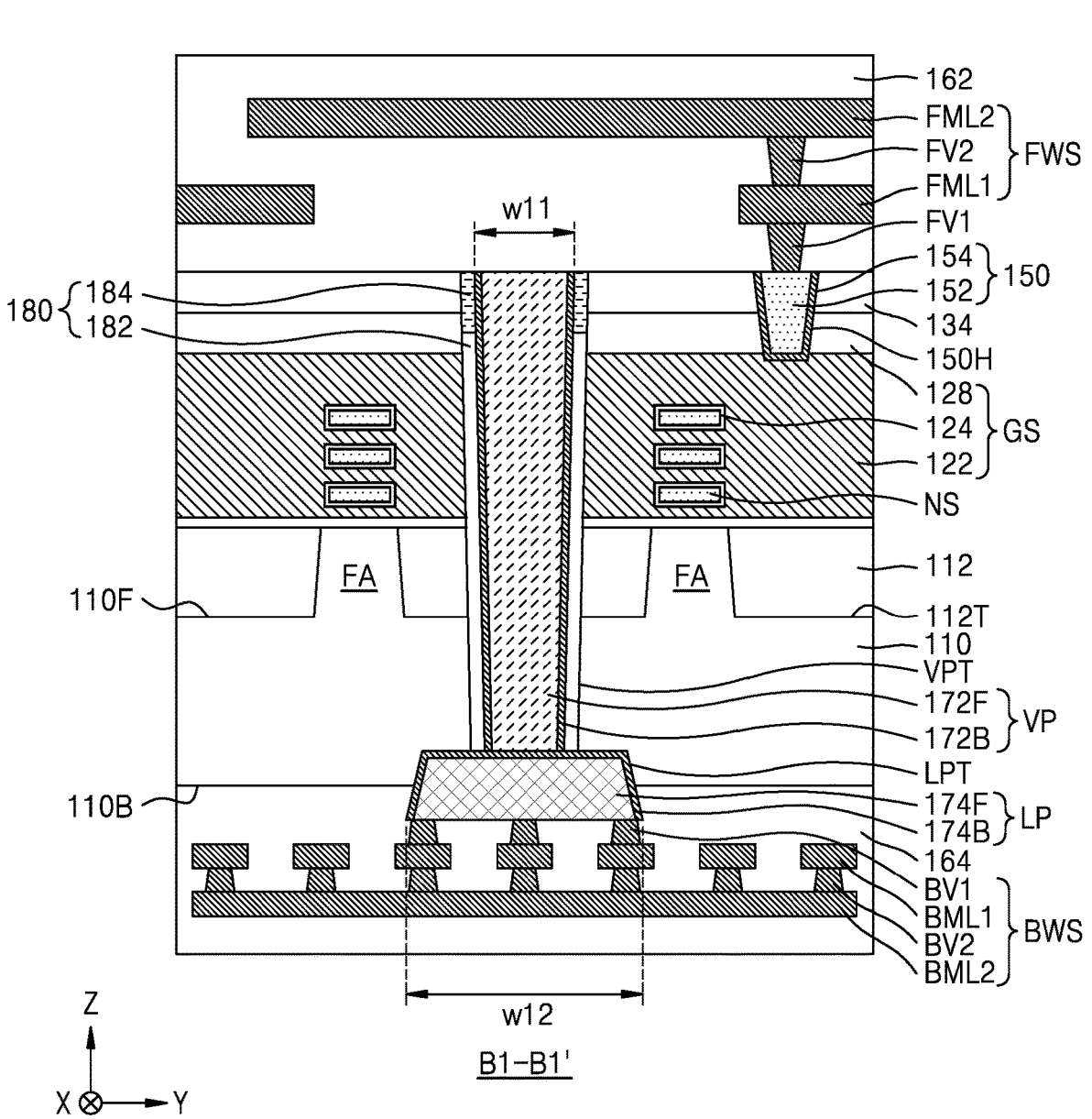
FIG. 4 is a cross-sectional view taken along a line B1-B1' of FIG. 2.
Figure 5:
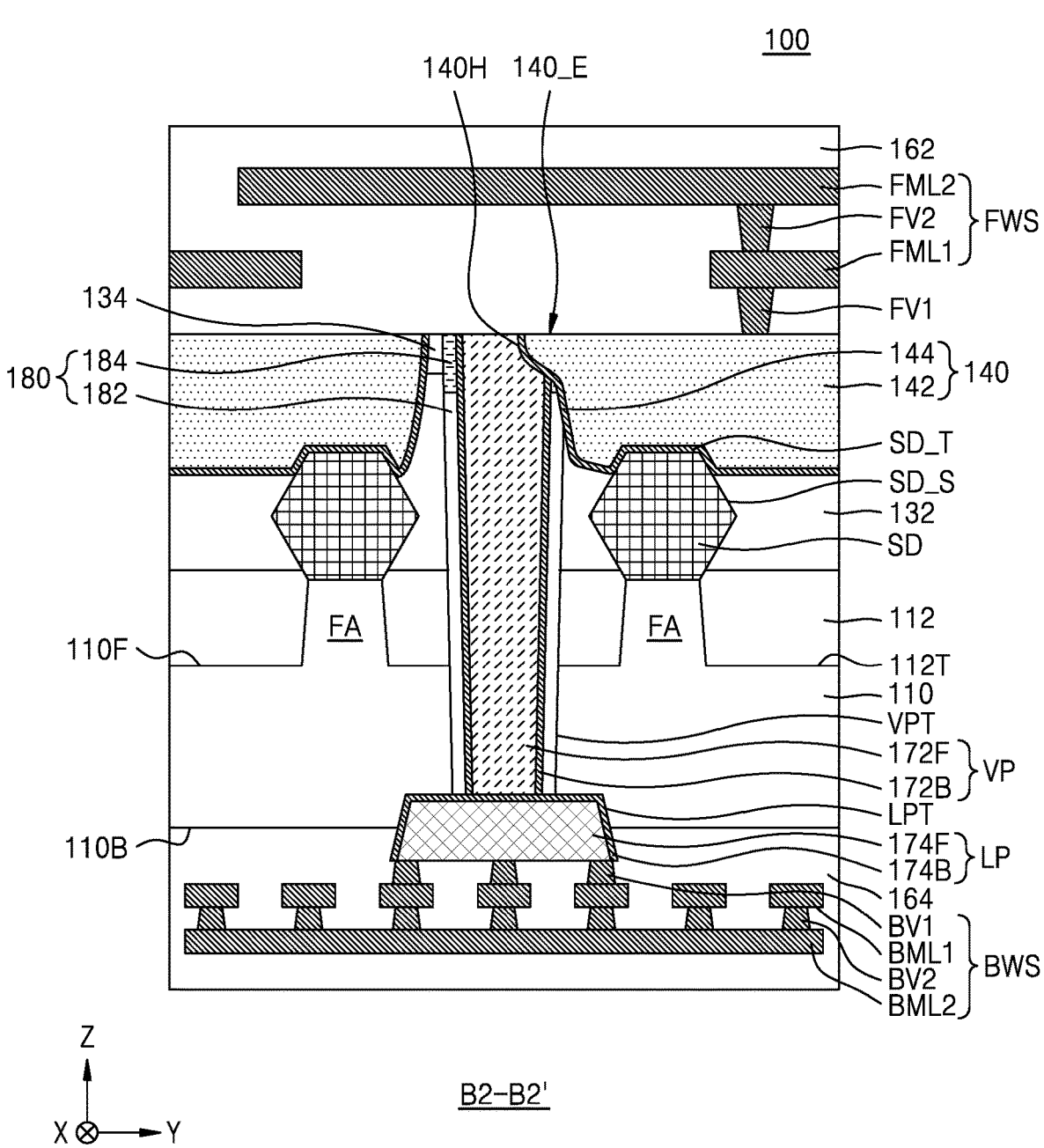
FIG. 5 is a cross-sectional view taken along a line B2-B2' of FIG. 2.

FIG. 1 is a schematic layout diagram showing an integrated circuit device 100 according to example embodiments. FIG. 2 is an enlarged layout view of a portion II of FIG. 1. FIG. 3 is a cross-sectional view taken along a line A1-A1' of FIG. 2, FIG. 4 is a cross-sectional view taken along a line B1-B1' of FIG. 2, and FIG. 5 is a cross-sectional view taken along a line B2-B2' of FIG. 2.

Referring to FIGS. 1 to 5, the integrated circuit device 100 may include a plurality of cells CR arranged on a first surface 110F of a substrate 110 and a back wiring structure BWS disposed on a second surface 110B of the substrate 110.

The plurality of cells CR may be arranged in a matrix shape in a first horizontal direction X and a second horizontal direction Y parallel to the first surface 110F of the substrate 110. The plurality of cells CR may be regions in which various types of logic cells included in a logic circuit are respectively arranged.

In embodiments exemplified in FIGS. 1 to 5, the integrated circuit device 100 may constitute a logic cell including a multi-bridge channel FET (MBCFET) device. However, the inventive concept is not limited thereto, and the integrated circuit device 100 may include a planar FET device, a gate-all-around type FET device, a finFET device, a FET device based on a 2-dimensional material like a MoS$_2$ semiconductor gate electrode, etc.

On the first surface 110F of the substrate 110, a plurality of ground lines VSS and a plurality of power lines VDD may extend lengthwise in the first horizontal direction X and may be alternately arranged in the second horizontal direction Y. Therefore, a cell boundary CBD of one cell CR in the second horizontal direction Y may be disposed to overlap one ground line VSS and one power line VDD. Here, the cell CR in which one ground line VSS, one power line VDD adjacent thereto, and the cell boundary CBD overlap may be referred to as a single height cell. The cell CR, which is a single height cell, may have a first height h01 in the second horizontal direction Y.

The plurality of ground lines VSS and the plurality of power lines VDD may each include a vertical power wiring layer VP disposed inside a vertical power trench VPT extending from the first surface 110F of the substrate 110 into the substrate 110. The vertical power wiring layer VP may be connected to a landing pad LP disposed on the second surface 110B of the substrate 110 and may be connected to the back wiring structure BWS disposed on the second surface 110B of the substrate 110 through the landing pad LP. Therefore, a power voltage and a ground voltage may be supplied from the back wiring structure BWS to the plurality of ground lines VSS and the plurality of power lines VDD.

Cell boundaries CBD of the plurality of cells CR in the first horizontal direction X may be arranged to overlap a separation structure DB. The separation structure DB may extend lengthwise in the second horizontal direction Y and electrically insulate one cell CR from another cell CR adjacent thereto. The separation structure DB may include an insulating material.

The substrate 110 may include a first active region RX1 and a second active region RX2 spaced apart from each other in the second horizontal direction Y. For example, the plurality of cells CR may each be disposed to include the first active region RX1 and the second active region RX2. The plurality of cells CR may include transistors TR1 respectively formed on the first active region RX1 and the second active region RX2. For example, a transistor TR1 disposed on the first active region RX1 may be a PMOS transistor, and a transistor TR1 disposed on the second active region RX2 may be an NMOS transistor.

According to embodiments, the substrate 110 may include a group IV semiconductor like Si or Ge, a group IV-IV compound semiconductor like SiGe or SiC, or a group III-V compound semiconductor like GaAs, InAs, or InP. A plurality of fin-type active regions FA may protrude from the first surface 110F of the substrate 110 and extend lengthwise in the first horizontal direction X. According to embodiments, one fin-type active region FA may be disposed on the first active region RX1, and one fin-type active region FA may be disposed on the second active region RX2.

A device isolation layer 112 may be disposed on the first surface 110F of the substrate 110 to cover lower sidewalls of the fin-type active region FA. The device isolation layer 112 may fill the inside of a device isolation trench 112T formed between the fin-type active regions FA and may have, for example, a dual layer structure including an interface layer (not shown) and a buried insulating layer (not shown).

According to embodiments, a plurality of semiconductor patterns NS may be arranged above the fin-type active region FA to be spaced apart from one another in a vertical direction Z. The plurality of semiconductor patterns NS may each include a group IV semiconductor like Si or Ge, a group IV-IV compound semiconductor like SiGe or SiC, or a group III-V compound semiconductor like GaAs, InAs, or InP.

A plurality of gate structures GS may extend lengthwise in the second horizontal direction Y to surround the plurality of semiconductor patterns NS and may be arranged at a first gate interval CPP to be spaced apart from one another in the first horizontal direction X. The plurality of gate structures GS may each include a gate electrode 122, a gate insulation layer 124, gate spacers 126, and a gate capping layer 128. For example, the gate electrode 122 may extend on the fin-type active region FA in the second horizontal direction Y to surround the plurality of semiconductor patterns NS, and the gate insulation layer 124 may be disposed between the gate electrode 122 and the fin-type active region FA, between the gate electrode 122 and the device isolation layer 112, and between the gate electrode 122 and each of the plurality of semiconductor patterns NS. The gate spacers 126 may be arranged on both sidewalls of the gate electrode 122, and the gate capping layer 128 may extend on the gate electrode 122 in the second horizontal direction Y. As shown in the drawings, the gate insulation layers 124 may be arranged on both sidewalls of the gate capping layer 128. However, according to other embodiments, the gate capping layer 128 may be disposed on top surfaces of the gate electrode 122 and the gate insulation layer 124, and the gate spacers 126 may be arranged on both sidewalls of the gate capping layer 128.

According to embodiments, the gate electrode 122 may include a doped polysilicon, a metal, a conductive metal nitride, a conductive metal carbide, a conductive metal silicide, or a combination thereof. For example, the gate electrode 122 may include Al, Cu, Ti, Ta, W, Mo, TaN, NiSi, CoSi, TiN, WN, TiAl, TiAlN, TaCN, TaC, TaSiN, or combinations thereof. However, the inventive concept is not limited thereto. According to embodiments, the gate electrode 122 may include a work function metal-containing layer (not shown) and a gap-fill metal layer (not shown). The work function metal-containing layer may include at least one metal selected from among Ti, W, Ru, Nb, Mo, Hf, Ni, Co, Pt, Yb, Tb, Dy, Er, and Pd. The gap-fill metal layer may include a W layer or an Al layer. According to embodiments, the gate electrode 122 may have a stacked structure of TiAlC/TiN/W, a stacked structure of TiN/TaN/TiAlC/TiN/W, or a stacked structure of TiN/TaN/TiN/TiAlC/TiN/W. However, the inventive concept is not limited thereto.

According to embodiments, the gate insulation layer 124 may include a silicon oxide film, a silicon oxynitride film, a high-k dielectric film having a higher dielectric constant than a silicon oxide film, or a combination thereof. The high-k dielectric film may include a metal oxide or a metal oxynitride. For example, the high-k dielectric film that may be used as the gate insulation layer 124 may include, but is not limited to, $HfO_2$, HfSiO, HfSiON, HfTaO, HfSiO, HfZrO, $ZrO_2$, $Al_2O_3$, or a combination thereof.

According to embodiments, the gate spacer 126 may include silicon oxide ($SiO_x$), silicon nitride ($SiN_x$), silicon oxynitride ($SiO_xN_y$), silicon carbonitride ($SiC_xN_y$), silicon oxycarbonitride ($SiO_xC_yN_z$), or a combination thereof. According to embodiments, the gate capping layer 128 may include silicon nitride or silicon oxynitride.

Recesses RS extending lengthwise into the fin-type active region FA may be formed on both sides of the gate structure GS, and a source/drain region SD may be formed inside each recess RS. The source/drain region SD is formed inside the recess RS, and both ends of the plurality of semiconductor patterns NS may be connected to a source/drain region SD. The source/drain region SD may have a top surface disposed at a higher level than the top surface of the uppermost semiconductor pattern NS. As shown in FIG. 5, the source/drain region SD may have a plurality of slanted sidewalls SD_S and may have a vertical cross-sectional shape like a hexagonal shape, a pentagonal shape, a rhombus-like shape, or a polygonal shape with rounded corners, etc.

According to embodiments, the source/drain region SD may include a doped SiGe layer, a doped Ge layer, a doped SiC layer, or a doped InGaAs layer, but is not limited thereto. The recesses RS may be formed by removing portions of the semiconductor patterns NS on both sides of the gate structure GS, and the source/drain region SD may be formed by growing a semiconductor layer filling the inside of the recess RS through an epitaxial process. According to embodiments, the source/drain region SD may include a plurality of semiconductor layers having different compositions. For example, the source/drain region SD may include a lower semiconductor layer (not shown), an upper semiconductor layer (not shown), and a capping semiconductor layer (not shown) sequentially filling the recess RS.

For example, the lower semiconductor layer, the upper semiconductor layer, and the capping semiconductor layer may each include SiC, and Si and C contents thereof may be different from one another. In another example, the lower semiconductor layer, the upper semiconductor layer, and the capping semiconductor layer may each include SiGe and Si and Ge contents thereof may be different from one another.

An inter-gate insulation layer 132 may be formed between the gate structures GS to cover the source/drain region SD. The inter-gate insulation layer 132 may contact the source/drain region SD. In example embodiments, the inter-gate insulation layer 132 may contact one or more of the plurality of slanted sidewalls SD_S of the source/drain region SD. For example, the top surface of the inter-gate insulation layer 132 may be disposed at the same level as the top surface of the gate structure GS. An upper insulation layer 134 may be disposed on the inter-gate insulation layer 132 and the gate structure GS. The upper insulation layer 134 may contact top surfaces of the inter-gate insulation layer 132 and the gate structure GS. The inter-gate insulation layer 132 and the upper insulation layer 134 may include silicon oxide or silicon oxynitride.

A first contact 140 may be disposed on the source/drain region SD. For example, the first contact 140 may contact a top surface of the source/drain region SD. The first contact 140 may include a contact plug 142 and a conductive barrier layer 144 arranged inside a first contact hole 140H penetrating through the inter-gate insulation layer 132 and the upper insulation layer 134. A top surface of the first contact 140 may be coplanar with a top surface of the upper insulation layer 134. The inter-gate insulation layer 132 and the upper insulation layer 134 may contact side surfaces of the conductive barrier layer 144 of the first contact 140. The contact plug 142 may include at least one from among tungsten (W), cobalt (Co), molybdenum (Mo), nickel (Ni), ruthenium (Ru), copper (Cu), aluminum (Al), silicides thereof, or alloys thereof. The conductive barrier layer 144 may include ruthenium (Ru), titanium (Ti), titanium nitride (TiN), tantalum (Ta), tantalum nitride (TaN), tungsten (W), titanium silicon nitride (TiSiN), titanium silicide (Ti Si), and tungsten silicide (WSi). Although not shown, a metal silicide layer may be further disposed between the first contact 140 and the source/drain region SD.

The first contact 140 may be disposed to cover at least a portion of the slanted sidewalls SD_S of the source/drain region SD, and the bottom surface of the first contact 140 may be located at a level lower than that of a top surface SD_T of the source/drain area SD. Therefore, a relatively large contact area may be secured between the first contact 140 and the source/drain region SD.

A second contact 150 may be disposed on the gate structure GS. The second contact 150 may include a contact plug 152 and a conductive barrier layer 154 surrounding sidewalls and the bottom surface of the contact plug 152. The second contact 150 may be disposed inside a second contact hole 150H that penetrates through the upper insulation layer 134 and the gate capping layer 128 and exposes the top surface of the gate electrode 122. The upper insulation layer 134 and the gate capping layer 128 may contact side surfaces of the conductive barrier layer 154 of the second contact 150. A bottom surface of the second contact 150 may be at a lower level than a level of a top surface of the gate electrode 122.

A front wiring structure FWS may be disposed on the upper insulation layer 134. The front wiring structure FWS may include wiring layers, i.e., a first wiring layer FML1 and a second wiring layer FML2, and vias, i.e., a first via FV1 and a second via FV2, and an interlayer insulation layer 162 may be disposed on the upper insulation layer 134 to cover the front wiring structure FWS. In example embodiments, the interlayer insulation layer 162 may contact top surfaces of the first contact 140 and the upper insulation layer 134. For example, the interlayer insulating layer 162 may include a plurality of material layers, and each material layer may be disposed to cover top surfaces and bottom surfaces of the first wiring layer FML1 and the second wiring layer FML2 and surround sidewalls of the first via FV1 and the second via FV2. In example embodiments, the interlayer insulating layer 162 may contact top and bottom surfaces of the first and second wiring layers FML1 and FML2 and sidewalls of the first and second vias FV1 and FV2. According to embodiments, the interlayer insulation layer 162 may include an oxide film, a nitride film, an ultra low-k (ULK) film having an ultra low dielectric constant k from about 2.2 to about 2.4, or a combination thereof.

According to embodiments, as shown in FIGS. 3 to 5, the first via FV1 may be disposed on the top surface of the second contact 150, the first wiring layer FML1 may be disposed on the top surface of the first via FV1, the second via FV2 may be disposed on the top surface of the first wiring layer FML1, and the second wiring layer FML2 may be disposed on the top surface of the second via FV2. In example embodiments, the first via FV1 may contact the top surface of the second contact 150, the first wiring layer FML1 may contact the top surface of the first via FV1, the second via FV2 may contact the top surface of the first wiring layer FML1, and the second wiring layer FML2 may contact the top surface of the second via FV2. For example, the first wiring layer FML1 may extend lengthwise in the first horizontal direction X, and the second wiring layer FML2 may extend lengthwise in the second horizontal direction Y. However, unlike shown in FIG. 3, the first wiring layer FML1 and the second wiring layer FML2 may include three or more wiring layers, and extension directions of the first wiring layer FML1 and the second wiring layer FML2 are not limited to those shown in FIGS. 3 to 5.

The back wiring structure BWS may be disposed on the second surface 110B of the substrate 110. The back wiring structure BWS may include a power delivery network for applying a power voltage and a ground voltage to the transistors TR1 in the plurality of cells CR. According to embodiments, the back wiring structure BWS may include back wiring layers, i.e., a first back wiring layer BML1 and a second back wiring layer BML2, and back vias, i.e., a first back via BV1 and a second back via BV2, arranged above the second surface 110B of the substrate 110. For example, the first back wiring layer BML1 may be disposed above the second surface 110B of the substrate 110 at a first vertical level closer to the second surface 110B of the substrate 110 and, for example, may extend lengthwise in the first horizontal direction X. The second back wiring layer BML2 may be disposed at a second vertical level farther from the second surface 110B of the substrate 110 than the first vertical level and, for example, may extend lengthwise in the second horizontal direction Y. For example, the first back via BV1 may contact the landing pad LP, the first back wiring layer BML1 may contact the first back via BV1, the second back via BV2 may contact the first back wiring layer BML1, and the second back wiring layer BML2 may contact the second back via BV2. A back interlayer insulation layer 164 covering the back wiring structure BWS may be disposed on the second surface 110B of the substrate 110. In example embodiments, the back interlayer insulation layer 164 may contact the second surface 110B of the substrate 110.

The back wiring structure BWS may be electrically connected to the first contact 140 through the vertical power wiring layer VP and the landing pad LP. The vertical power wiring layer VP may be disposed in the vertical power trench VPT extending from the first surface 110F of the substrate 110 into the inside of the substrate 110 in the vertical direction Z, and the landing pad LP may be disposed in a landing pad trench LPT extending from the second surface 110B of the substrate 110 into the inside of the substrate 110 in the vertical direction Z. In example, the landing pad trench LPT may be recessed into the second surface 110B of the substrate 110. The vertical power wiring layer VP may include a wiring metal layer 172F and a conductive barrier layer 172B, and the landing pad LP may include a pad metal layer 174F and a conductive barrier layer 174B. The wiring metal layer 172F and the conductive barrier layer 172B may contact a top surface of the conductive barrier layer 174B. Liner structures 180 may be arranged on both sidewalls of the vertical power wiring layer VP.

According to embodiments, the vertical power trench VPT may penetrate through the upper insulation layer 134, the inter-gate insulation layer 132, the device isolation layer 112 and extend from the first surface 110F of the substrate 110 toward the second surface 110B of the substrate 110. The vertical power trench VPT may extend lengthwise in the first horizontal direction X along the cell boundary CBD.

A liner structure 180 may be disposed on an inner wall of the vertical power trench VPT, and the vertical power wiring layer VP may be disposed inside the vertical power trench VPT. The liner structure 180 may include a first liner 182 and a second liner 184. The first liner 182 may be disposed on the lower portion of the sidewall of the vertical power wiring layer VP and may include a first insulating material. The second liner 184 may be disposed on the upper portion of the sidewall of the vertical power wiring layer VP and may include a second insulating material which is different from the first insulating material. For example, the first and second liners 182 and 184 may contact sidewalls of the vertical power wiring layer VP, and the second liner 184 may contact a top surface of the conductive barrier layer 174B of the landing pad LP.

According to embodiments, the first insulating material may include silicon nitride or silicon oxynitride, and the second insulating material may include silicon oxide or silicon oxynitride. The second insulating material may include a material having an etch selectivity with respect to the first insulating material. According to embodiments, the second liner 184 may include a material having etching characteristics similar to those of the upper insulation layer 134 and the inter-gate insulation layer 132.

According to embodiments, the top surface of the first liner 182 may be disposed at a vertical level lower than that of the top surface of the vertical power wiring layer VP, and the top surface of the first liner 182 may be disposed at a vertical level higher than that of the top surface of the gate electrode 122. Also, the bottom surface of the first liner 182 may be disposed at the same vertical level as the bottom surface of the vertical power wiring layer VP.

The top surface of the second liner 184 may be disposed at the same level as the top surfaces of the first contact 140 and the vertical power wiring layer VP, and the bottom surface of the second liner 184 may be disposed on the top surface of the first liner 182. For example, the second liner 184 may be disposed between the upper insulation layer 134 and the vertical power wiring layer VP at the same vertical level as the top surface of the first contact 140.

According to embodiments, an upper portion of the vertical power wiring layer VP may contact an extension 140_E of the first contact 140. For example, the extension 140_E may be disposed to vertically overlap the vertical power wiring layer VP and contact the wiring metal layer 172F and the conductive barrier layer 172B of the vertical power wiring layer VP. The bottom surface of the extension 140_E of the first contact 140 may be covered by the second liner 184.

According to an example manufacturing method, in a process of forming the first contact hole 140H by removing a portion of the upper insulation layer 134 and a portion of the inter-gate insulation layer 132, the first contact 140 may be formed by also removing an upper portion of the vertical power wiring layer VP and filling the first contact hole 140H with a metal material. In this case, the second liner 184 including a second insulating material having etching characteristics similar to that of the upper insulation layer 134 may be disposed on the upper sidewall of the vertical power wiring layer VP. As a result, the first contact hole 140H may be formed to have a flat sidewall and a bottom profile without a sharp bottom level difference, and a relatively large contact area between the extension 140_E of the first contact 140 and the vertical power wiring layer VP may be secured.

According to embodiments, the top surface of the landing pad LP may contact the bottom surface of the vertical power wiring layer VP, and the bottom surface of the landing pad LP may be surrounded by the back interlayer insulation layer 164. For example, the landing pad trench LPT may be formed by removing a portion of the back interlayer insulation layer 164 and a portion of the substrate 110 from the second surface 110B of the substrate 110, and the landing pad trench LPT may have slanted sidewalls, such that the width of the upper portion of the landing pad trench LPT is smaller than the width of the lower portion of the landing pad trench LPT. However, the inventive concept is not limited thereto.

According to other embodiments, the landing pad trench LPT may be formed only inside the substrate 110, and the bottom surface of the landing pad LP may contact the back interlayer insulation layer 164. According to other embodiments, the sidewalls of the landing pad trench LPT may extend substantially vertically without being slanted. According to other embodiments, the landing pad trench LPT may be formed only inside the back interlayer insulation layer 164 and may not extend into the substrate 110, and the vertical power wiring layer VP may extend longer than that shown in FIG. 5 to the second surface 110B and contact the top surface of the landing pad LP.

According to embodiments, the conductive barrier layer 172B of the vertical power wiring layer VP may be disposed only on the sidewall of the vertical power trench VPT and may not cover the bottom surface of the wiring metal layer 172F (e.g., the conductive barrier layer 172B may not be disposed at the bottom of the vertical power trench VPT). The conductive barrier layer 174B of the landing pad LP may cover the entire top surface of the pad metal layer 174F, and the top surface of the conductive barrier layer 174B may contact the bottom surface of the wiring metal layer 172F. In this case, the pad metal layer 174F of the landing pad LP may be disposed not to directly contact the wiring metal layer 172F of the vertical power wiring layer VP.

According to other embodiments, unlike that shown in FIG. 5, the conductive barrier layer 172B of the vertical power wiring layer VP may be disposed to cover the sidewall and the bottom surface of the vertical power trench VPT, the bottom surface of the conductive barrier layer 172B may contact the top surface of the conductive barrier layer 174B of the landing pad LP, and the bottom surface of the wiring metal layer 172F may be disposed to not contact the top surface of the conductive barrier layer 174B.

According to embodiments, a width w11 of the vertical power wiring layer VP in the second horizontal direction Y may be within the range from about 5 nm to about 100 nm, but is not limited thereto. The width w11 may be a maximum width of the vertical power wiring layer VP in the second horizontal direction Y. Also, the height of the vertical power wiring layer VP in the vertical direction may be within the range from about 30 nm to about 500 nm, but is not limited thereto. According to embodiments, a width w12 of the landing pad LP in the second horizontal direction Y may be within the range from about 5 nm to about 100 nm, but is not limited thereto. The width w12 may be a maximum width of the landing pad LP in the second horizontal direction Y. Also, the height of the landing pad LP in the vertical direction may be within the range from about 30 nm to about 500 nm, but is not limited thereto. In example embodiments, the height of the first liner 182 in the vertical direction may be smaller than the height of the vertical power wiring layer VP in the vertical direction.

The integrated circuit device 100 according to embodiments may include the first contact 140 directly interconnecting the source/drain region SD and the vertical power wiring layer VP, and the liner structures 180 including a heterogenous material may be arranged on both sidewalls of the vertical power wiring layer VP. Therefore, a bridging defect that may occur when the gate electrode 122 is exposed during an etching process for forming the first contact hole 140H may be prevented, the extension 140_E of the first contact 140 may have a relatively flat sidewall profile, and a relatively large contact area between the extension 140_E and the vertical power wiring layer VP may be secured. Therefore, the integrated circuit device 100 may have improved electrical performance.

Figure 6:
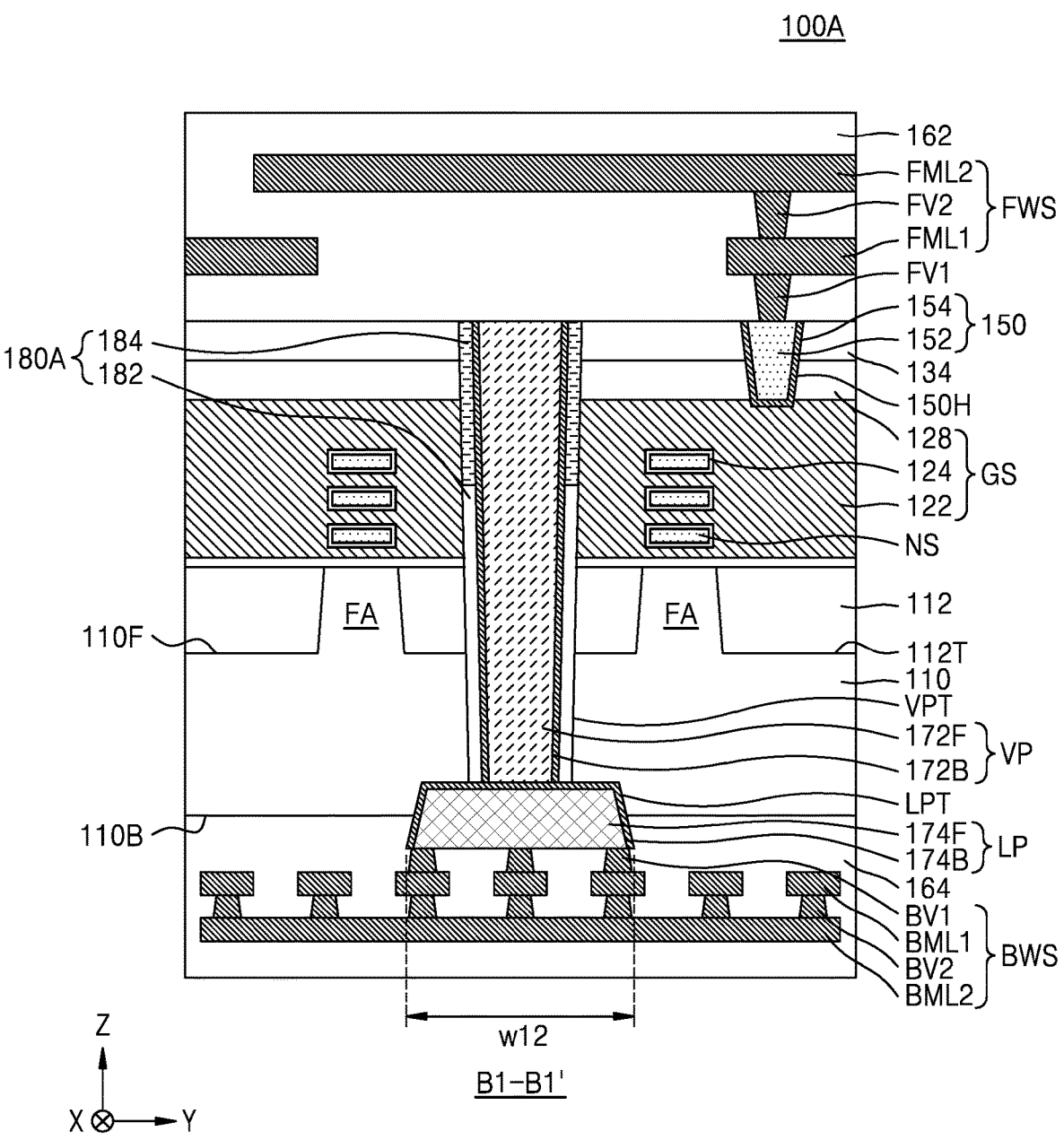
FIGS. 6 and 7 are cross-sectional views of an integrated circuit device according to example embodiments.
Figure 7:
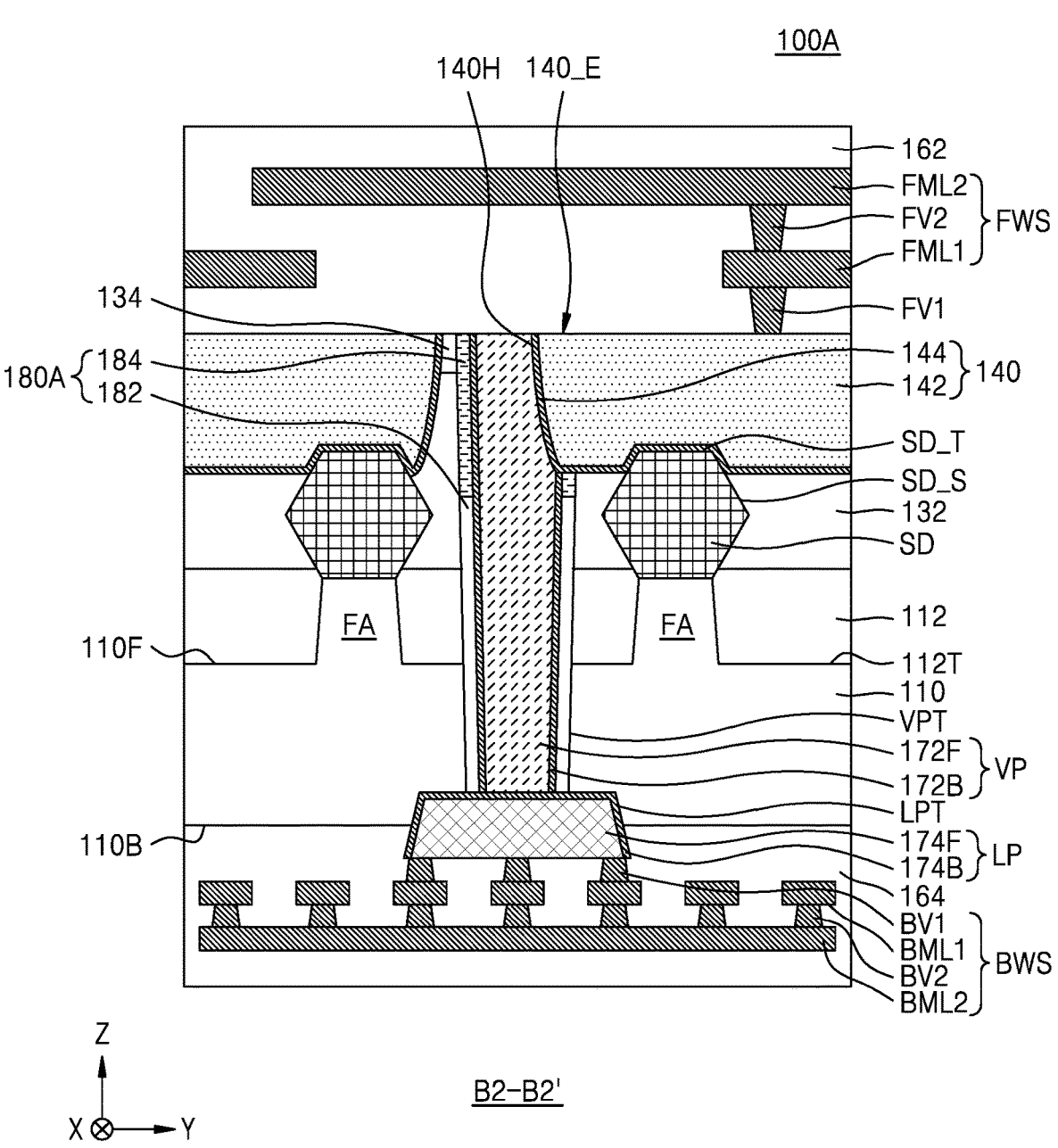

FIGS. 6 and 7 are cross-sectional views of an integrated circuit device 100A according to example embodiments. In detail, FIG. 6 is a cross-sectional view corresponding to a cross-section taken along a line B1-B1' in FIG. 2, and FIG. 7 is a cross-sectional view corresponding to a cross-section taken along a line B2-B2' in FIG. 2. In FIGS. 6 and 7, reference numerals the same as those in FIGS. 1 to 5 denote the same elements.

Referring to FIGS. 6 and 7, liner structures 180A arranged on both sidewalls of the vertical power wiring layer VP may include the first liner 182 and the second liner 184. The first liner 182 may have the top surface disposed at a vertical level lower than that of the top surface of the gate electrode 122, and the first liner 182 may have the top surface disposed at a vertical level lower than that of the bottom surface of the first contact 140. The second liner 184 may be disposed at a higher vertical level than that of the first liner 182, such that the bottom surface of the second liner 184 contacts the top surface of the first liner 182.

According to embodiments, a portion of the sidewall of the second liner 184 may contact the sidewall of the gate electrode 122, but the inventive concept is not limited thereto. According to other embodiments, unlike that shown in FIG. 6, the gate insulation layer 124 may extend from the top surface of the device isolation layer 112 between the sidewall of the gate electrode 122 and the liner structure 180 in a vertical direction and, in this case, a portion of the gate insulation layer 124 may be disposed between the second liner 184 and the gate electrode 122.

According to an example manufacturing method, in a process of forming the first contact hole 140H by removing a portion of the upper insulation layer 134 and a portion of the inter-gate insulation layer 132, the first contact 140 may be formed by also removing an upper portion of the vertical power wiring layer VP and filling the first contact hole 140H with a metal material. In this case, the second liner 184 including a second insulating material having etching characteristics similar to that of the upper insulation layer 134 may be disposed on the upper sidewall of the vertical power wiring layer VP. As a result, the first contact hole 140H may be formed to have a flat sidewall and a bottom profile without a sharp bottom level difference, and a relatively large contact area between the extension 140_E of the first contact 140 and the vertical power wiring layer VP may be secured.

FIGS. 8 and 9 are cross-sectional views of an integrated circuit device 100B according to example embodiments. In detail, FIG. 8 is a cross-sectional view corresponding to a cross-section taken along a line B1-B1' in FIG. 2, and FIG. 9 is a cross-sectional view corresponding to a cross-section taken along a line B2-B2' in FIG. 2. In FIGS. 8 and 9, reference numerals same as those in FIGS. 1 to 7 may denote the same elements.

Referring to FIGS. 8 and 9, liner structures 180B may include the first liner 182 and the second liner 184, and the first liner 182 may have the top surface disposed at a level higher than that of the top surface of the gate electrode 122 and lower than that of the top surface of the first contact 140. The first liner 182 may have the top surface disposed at a level lower than that of the top surface of the gate capping layer 128. The second liner 184 may include a first portion 184_1 disposed at a level higher than that of the top surface of the first liner 182 and a second portion 184_2 disposed at a level lower than that of the top surface of the first liner 182 and extending in the vertical direction Z along the sidewall of the first liner 182.

As shown in FIG. 8, the first portion 184_1 of the second liner 184 may be disposed on the upper portion of the sidewall of the vertical power wiring layer VP, and the second portion 184_2 of the second liner 184 and the first liner 182 may be arranged on the sidewall of the vertical power wiring layer VP below the first portion 184_1. A stepped portion may be defined between the first portion 184_1 and the second portion 184_2 of the second liner 184, and a protrusion VP_P may be defined at a position corresponding to the stepped portion of the second liner 184. The second portion 184_2 of the second liner 184 may contact a side surface of the first liner 182 and a top surface of the conductive barrier layer 174B of the landing pad LP.

FIG. 10 is a cross-sectional view of an integrated circuit device 100B-1 according to example embodiments. The integrated circuit device 100B-1 of FIG. 10 is similar to the integrated circuit device 100B shown in FIGS. 8 and 9 except for the shape of the first contact 140.

Referring to FIG. 10, an upper portion of the vertical power wiring layer VP may contact an extension 140_E of the first contact 140. For example, the extension 140_E may be disposed to vertically overlap the vertical power wiring layer VP and contact the wiring metal layer 172F and the conductive barrier layer 172B of the vertical power wiring layer VP. The bottom surface of the extension 140_E of the first contact 140 may be covered by the first liner 182 and the second liner 184.

FIGS. 11 and 12 are cross-sectional views of an integrated circuit device 100C according to example embodiments. In detail, FIG. 11 is a cross-sectional view corresponding to a cross-section taken along a line B1-B1' in FIG. 2, and FIG. 12 is a cross-sectional view corresponding to a cross-section taken along a line B2-B2' in FIG. 2. In FIGS. 11 and 12, reference numerals the same as those in FIGS. 1 to 10 denote the same elements.

Referring to FIGS. 11 and 12, liner structures 180C may include the first liner 182 and the second liner 184, and the first liner 182 may have the top surface disposed at a level lower than that of the top surface of the gate electrode 122 and lower than that of the bottom surface of the first contact 140. The second liner 184 may include a first portion 184_1 disposed at a level higher than that of the top surface of the first liner 182 and a second portion 184_2 disposed at a level lower than that of the top surface of the first liner 182 and extending in the vertical direction Z along the sidewall of the first liner 182.

As shown in FIG. 11, the first portion 184_1 of the second liner 184 may be disposed on the upper portion of the sidewall of the vertical power wiring layer VP, and the second portion 184_2 of the second liner 184 and the first liner 182 may be arranged on the lower portion of the sidewall of the vertical power wiring layer VP. A stepped portion may be defined between the first portion 184_1 and the second portion 184_2 of the second liner 184, and a protrusion VP_P may be defined at a position corresponding to the stepped portion of the second liner 184. The protrusion VP_P may be disposed at a level lower than that of the bottom surface of the first contact 140.

FIGS. 13 and 14 are cross-sectional views of an integrated circuit device 100D according to example embodiments. In detail, FIG. 13 is a cross-sectional view corresponding to a cross-section taken along a line B1-B1' in FIG. 2, and FIG. 14 is a cross-sectional view corresponding to a cross-section taken along a line B2-B2' in FIG. 2. In FIGS. 13 and 14, reference numerals the same as those in FIGS. 1 to 12 denote the same elements.

Referring to FIGS. 13 and 14, a gate cut insulation layer GCI is disposed on a sidewall of the liner structure 180 and may extend in the first horizontal direction X. Therefore, a structure in which the liner structures 180 and gate cut insulation layers GCI are sequentially arranged on both sidewalls of the vertical power wiring layer VP may extend in the first horizontal direction X. The gate cut insulation layer GCI may have the bottom surface disposed at the same level as the bottom surface of the gate electrode 122 and have the top surface disposed at the same level as the top surface of the liner structure 180. In addition, the gate cut insulation layer GCI may have the bottom surface disposed at the same level as the bottom surface of inter-gate insulation layer 132. Also, the gate cut insulation layer GCI may be disposed between the gate electrode 122 and the liner structure 180 as shown in FIG. 12 and may also be disposed between the inter-gate insulation layer 132 and the liner structure 180 as shown in FIG. 14.

According to other embodiments, the gate cut insulation layer GCI may be formed by removing a portion of the gate structure GS and filling the removed portion with an insulating material. In this case, the gate cut insulation layer GCI is disposed between the gate electrode 122 and the liner structure 180 as shown in FIG. 13. However, unlike that shown in FIG. 14, the gate cut insulation layer GCI may not be disposed between the inter-gate insulation layer 132 and may directly contact sidewall of the liner structure 180.

FIG. 15 is a cross-sectional view of an integrated circuit device 100D-1 according to example embodiments. The integrated circuit device 100D-1 of FIG. 15 is similar to the integrated circuit device 100D shown in FIGS. 14 and 15 except for the shape of the first contact 140.

Referring to FIG. 15, an upper portion of the vertical power wiring layer VP may contact an extension 140_E of the first contact 140. For example, the extension 140_E may be disposed to vertically overlap the vertical power wiring layer VP and contact the wiring metal layer 172F and the conductive barrier layer 172B of the vertical power wiring layer VP. The bottom surface of the extension 140_E of the first contact 140 may be covered by the first liner 182 or the second liner 184.

FIGS. 16 and 17 are cross-sectional views of an integrated circuit device 100E according to example embodiments. In detail, FIG. 16 is a cross-sectional view corresponding to a cross-section taken along a line B1-B1' in FIG. 2, and FIG. 17 is a cross-sectional view corresponding to a cross-section taken along a line B2-B2' in FIG. 2. In FIGS. 16 and 17, reference numerals same as those in FIGS. 1 to 15 may denote the same elements.

Referring to FIGS. 16 and 17, the gate cut insulation layer GCI may be disposed on the liner structure 180 on one sidewall of the vertical power wiring layer VP instead of both sidewalls of the vertical power wiring layer VP. In a manufacturing process according to embodiments, a gate cut region (not shown) may be formed by removing portions of the gate structure GS and the inter-gate insulation layer 132, and the gate cut insulation layer GCI may be formed by filling the gate cut region with an insulating material. Thereafter, the vertical power trench VPT may be formed by removing a portion of the gate cut insulation layer GCI, and the liner structure 180 and the vertical power wiring layer VP may be formed in the vertical power trench VPT. When misalignment of a mask pattern occurs during a process of forming the vertical power trench VPT, the vertical power trench VPT may be formed, such that the gate cut insulation layer GCI remains on one sidewall of the vertical power trench VPT. In this case, the gate cut insulation layer GCI may be disposed on one sidewall of the vertical power wiring layer VP.

FIGS. 18 to 20 are cross-sectional views of an integrated circuit device 100F according to example embodiments. In detail, FIG. 18 is a cross-sectional view corresponding to a cross-section taken along a line A1-A1' of FIG. 2, FIG. 19 is a cross-sectional view corresponding to a cross-section taken along a line B1-B1' of FIG. 2, and FIG. 20 is a cross-sectional view corresponding to a cross-section taken along a line B2-B2' of FIG. 2. In FIGS. 18 to 20, reference numerals the same as those in FIGS. 1 to 17 denote the same elements.

Referring to FIGS. 18 to 20, an upper capping layer 136 may be disposed above the vertical power trench VPT, e.g., on the top surface of the vertical power wiring layer VP, and the upper insulation layer 134 described above with reference to FIGS. 3 to 5 may be omitted. The upper capping layer 136 may function as a mask layer for forming the first contact 140 in a self-aligned manner. The sidewall of the upper portion of the first contact 140 may be surrounded by the upper capping layer 136, and the sidewall of the lower portion of the first contact 140 may be surrounded by the inter-gate insulation layer 132. According to embodiments, the upper capping layer 136 may include silicon nitride, but is not limited thereto. The liner structure 180 may be disposed on sidewalls of the upper capping layer 136. For example, the liner structure 180 may contact the sidewalls of the upper capping layer 136. The upper surface of the upper capping layer 136 may be coplanar with an upper surface of the liner structure 180 and an upper surface of the upper insulation layer 134.

FIGS. 18 to 20 show that the liner structure 180 has a structure in which the first liner 182 and the second liner 184 are respectively arranged on the lower portion and the upper portion of the sidewall of the vertical power trench VPT. However, according to other embodiments, liner structures 180A, 180B, and 180C described above with reference to FIGS. 6 to 12 may be arranged instead of the liner structure 180. Also, as described above with reference to FIGS. 13 to 17, the gate cut insulation layer GCI may be further disposed on the sidewall of the liner structure 180.

FIG. 21 is a cross-sectional view of an integrated circuit device 100G according to example embodiments.

Referring to FIG. 21, a liner structure 180G may include the first liner 182 and the second liner 184 sequentially arranged on the inner wall of the vertical power trench VPT. The first liner 182 and the second liner 184 may be formed throughout the entire height of the vertical power trench VPT from the bottom of the vertical power trench VPT to the top of the vertical power trench VPT. In example embodiments, upper surfaces of the first liner 182 and the second liner 184 may be coplanar with an upper surface of the vertical power wiring layer VP, and lower surfaces of the first liner 182 and the second liner 184 may be coplanar with a lower surface of the vertical power wiring layer VP. For example, the first liner 182 may be disposed on the inner wall of the vertical power trench VPT, and the second liner 184 may be disposed on the first liner 182 on the inner wall of the vertical power trench VPT. Therefore, the second liner 184 may not directly contact the inter-gate insulation layer 132 and the upper insulation layer 134.

According to embodiments, the first liner 182 may include silicon oxide and the second liner 184 may include silicon oxide. However, the inventive concept is not limited thereto.

FIG. 22 is a cross-sectional view of an integrated circuit device 200 according to example embodiments.

Referring to FIG. 22, the integrated circuit device 200 may include a FinFET transistor. For example, a plurality of fin-type active regions FA may protrude from the first surface 110F of the substrate 110 in the vertical direction Z on a first active region RX1 and a second active region RX2. The device isolation layer 112 may be disposed on both sidewalls of the fin-type active region FA, deep trenches 114T may be arranged outside the second active region RX2 and between the first active region RX1 and the second active region RX2, and a deep trench isolation layer 114 may be disposed inside the deep trenches 114T. The gate structure GS may further include an interfacial layer IF disposed between the gate insulation layer 124 and the fin-type active region FA, and the interfacial layer IF may include silicon oxide. For example, the interfacial layer IF may contact an upper and side surfaces of the fin-type active region FA.

FIG. 22 shows that the liner structure 180 has a structure in which the first liner 182 and the second liner 184 are respectively arranged on the lower portion and the upper portion of the sidewall of the vertical power trench VPT. However, according to other embodiments, liner structures 180A, 180B, and 180C described above with reference to FIGS. 6 to 12 may be arranged instead of the liner structure 180. Also, as described above with reference to FIGS. 13 to 17, the gate cut insulation layer GCI may be further disposed on the sidewall of the liner structure 180.

FIGS. 23 to 31B are cross-sectional views of a method of manufacturing the integrated circuit device 100 according to example embodiments. In detail, FIGS. 23, 24A, 25A, and 26A are cross-sectional views corresponding to a cross-section taken along a line A1-A1' of FIG. 2, FIGS. 24B, 25B, 26B, 27A, 30A, and 31A are cross-sectional views corresponding to a cross-section taken along a line B1-B1' of FIG. 2, and FIGS. 25C, 27B, 28, 29, 30B, and 31B are cross-sectional views corresponding to a cross-section taken along a line B2-B2' of FIG. 2.

Figure 23:
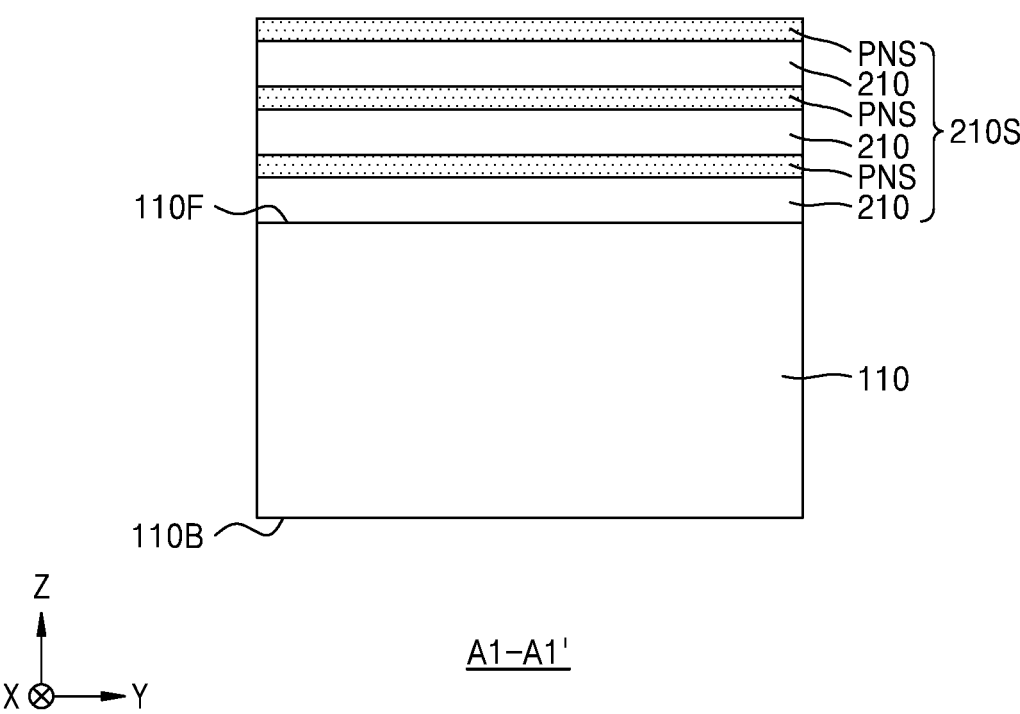

Referring to FIG. 23, a sacrificial layer stack 210S may be formed by alternately and sequentially forming the sacrificial layer 210 and a channel semiconductor layer PNS on the first surface 110F of the substrate 110. The sacrificial layer 210 and the channel semiconductor layer PNS may be formed through an epitaxial process.

According to embodiments, the sacrificial layer 210 and the channel semiconductor layer PNS may include materials having etch selectivity with respect to each other. For example, the sacrificial layer 210 and the channel semiconductor layer PNS may each include a monocrystalline layer of a group IV semiconductor, a group IV-IV compound semiconductor, or a group III-V compound semiconductor, wherein the sacrificial layer 210 and the channel semiconductor layer PNS may include different materials. According to an embodiment, the sacrificial layer 210 may include SiGe, and the channel semiconductor layer PNS may include monocrystalline silicon.

According to embodiments, the epitaxial process may be a CVD process like vapor-phase epitaxy (VPE), or ultra-high vacuum chemical vapor deposition (UHV-CVD), molecular beam epitaxy, or a combination thereof. In the epitaxial process, a liquid or gaseous precursor may be used as a precursor needed for forming the sacrificial layer 210 and the channel semiconductor layer PNS.

Figure 24A:
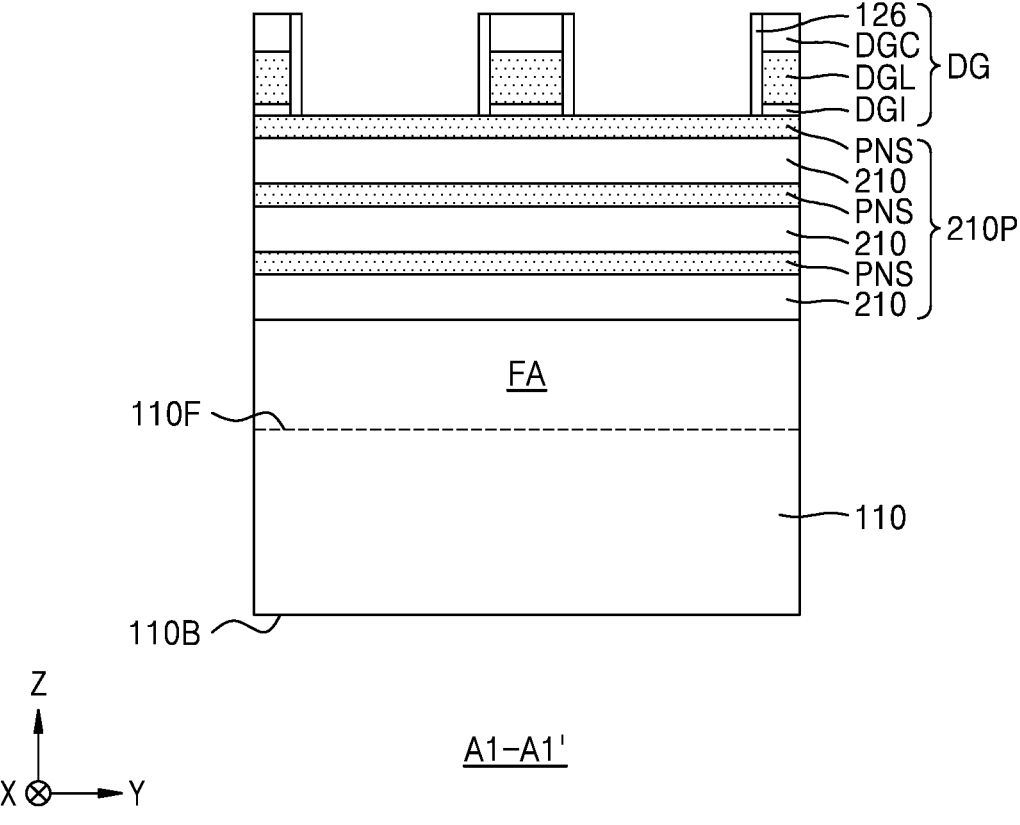
Figure 24B:
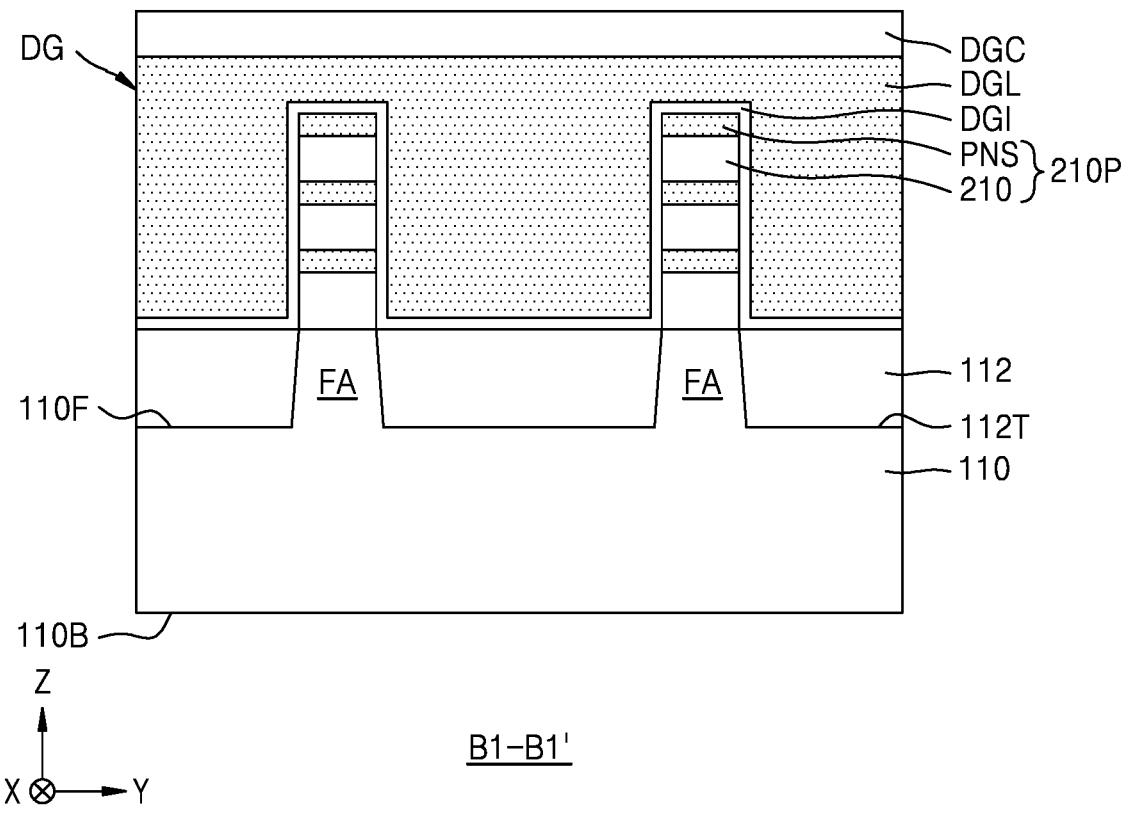

Referring to FIGS. 24A and 24B, after a hard mask pattern (not shown) extending to a certain length in the first direction (X direction) is formed on the channel semiconductor layer PNS, a sacrificial layer pattern 210P and the device isolation trench 112T may be formed by etching the sacrificial layer 210, the channel semiconductor layer PNS, and the substrate 110 by using the hard mask pattern as an etching mask.

Thereafter, after the inside of the device isolation trench 112T is filled with an insulating material, the device isolation layer 112 filling the device isolation trench 112T may be formed by planarizing the upper portion of the insulating material. The fin-type active regions FA may be defined in the substrate 110 by the device isolation layer 112.

Thereafter, dummy gate structures DG may be formed on the sacrificial layer pattern 210P and the device isolation layer 112. The dummy gate structures DG may each include a dummy gate insulation layer DGI, a dummy gate line DGL, a dummy gate capping layer DGC, and a gate spacer 126.

For example, the dummy gate line DGL may include polysilicon, and the dummy gate capping layer DGC may include silicon nitride. The dummy gate insulation layer DGI may include a material having an etching selectivity to that of the dummy gate line DGL, and may include, for example, at least one layer selected from among a thermal oxide, silicon oxide, and silicon nitride. The gate spacers 126 may include silicon nitride.

Figure 25A:
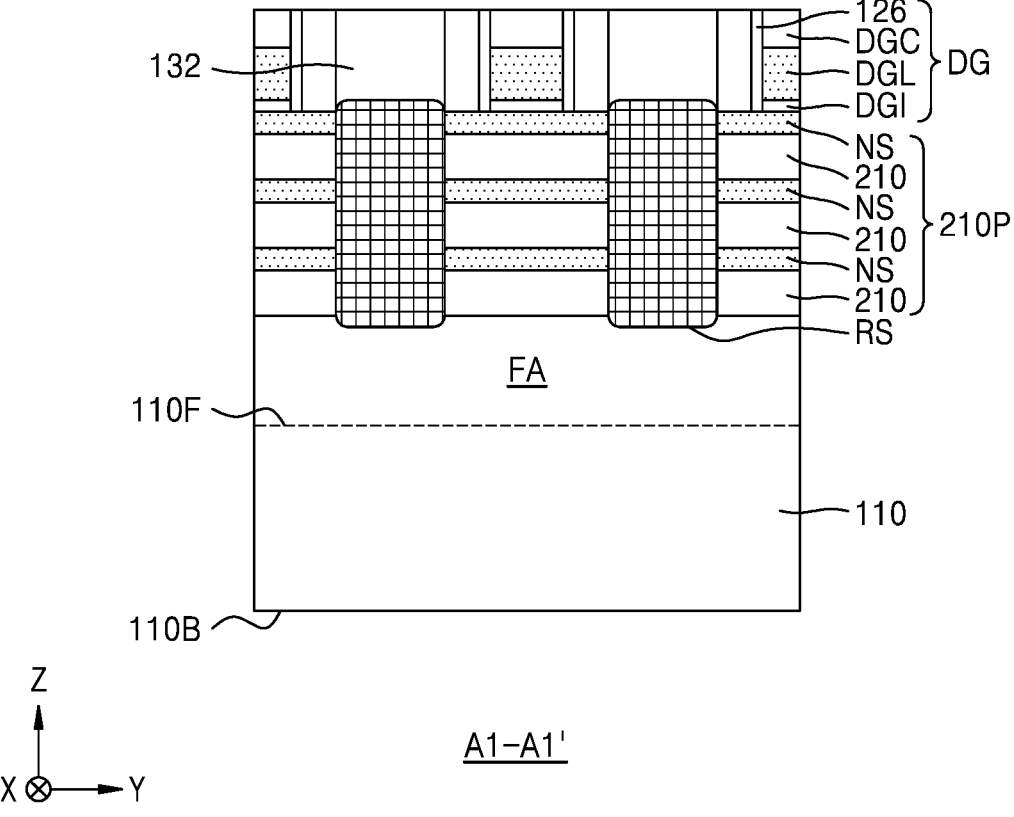
Figure 25B:
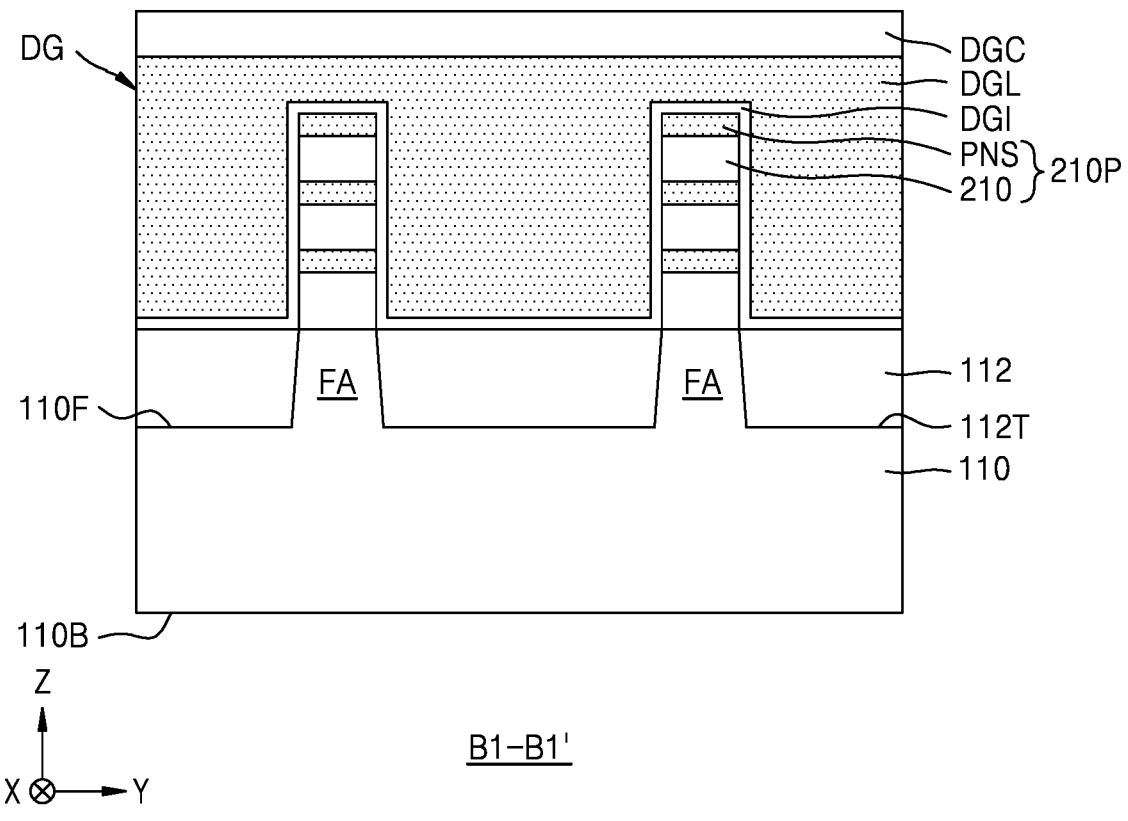
Figure 25C:
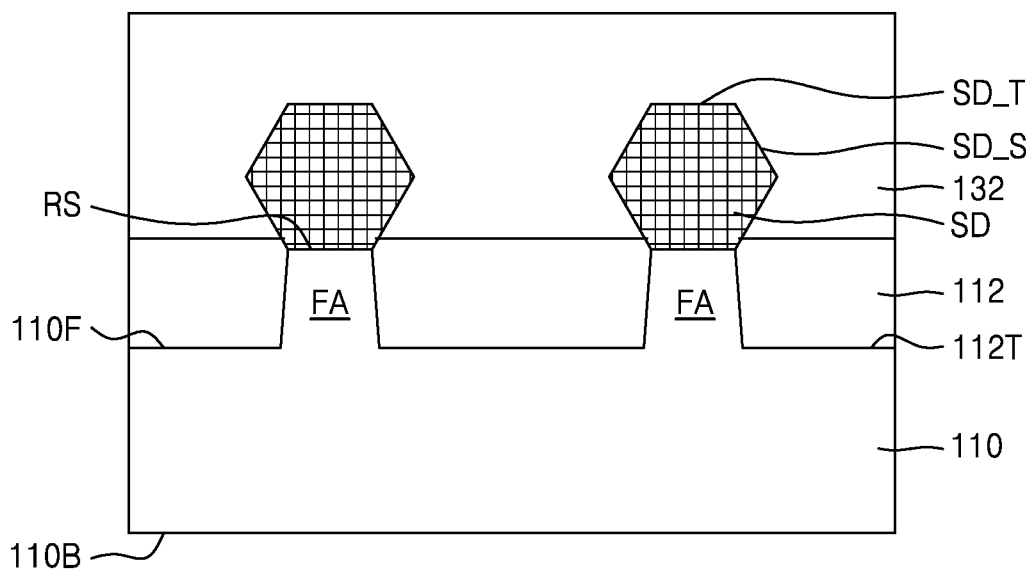
Figure 25C:
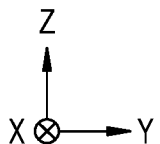

Referring to FIGS. 25A to 25C, the recesses RS are formed on both sides of the dummy gate structures DG by etching the sacrificial layer pattern 210P and portions of the substrate 110 on both sides of the dummy gate structures DG. As the recesses RS are formed, the sacrificial layer pattern 210P may be separated into the plurality of semiconductor patterns NS.

Thereafter, the source/drain region SD may be formed in the recess RS. For example, the source/drain region SD may be formed by epitaxially growing a semiconductor material from surfaces of the plurality of semiconductor patterns NS, the sacrificial layer 210, and the substrate 110 that are exposed on the inner wall of the recess RS. The source/drain region SD may include at least one of an epitaxially grown Si layer, an epitaxially grown SiC layer, an epitaxially grown SiGe layer, and an epitaxially grown SiP layer.

Thereafter, the inter-gate insulation layer 132 may be formed on sidewalls of the gate spacer 126 and the source/drain region SD. The upper portions of the dummy gate structure DG and the inter-gate insulation layer 132 may be planarized, thereby removing the dummy gate capping layer DGC of the dummy gate structure DG and exposing the top surface of the dummy gate line DGL.

Figure 26A:
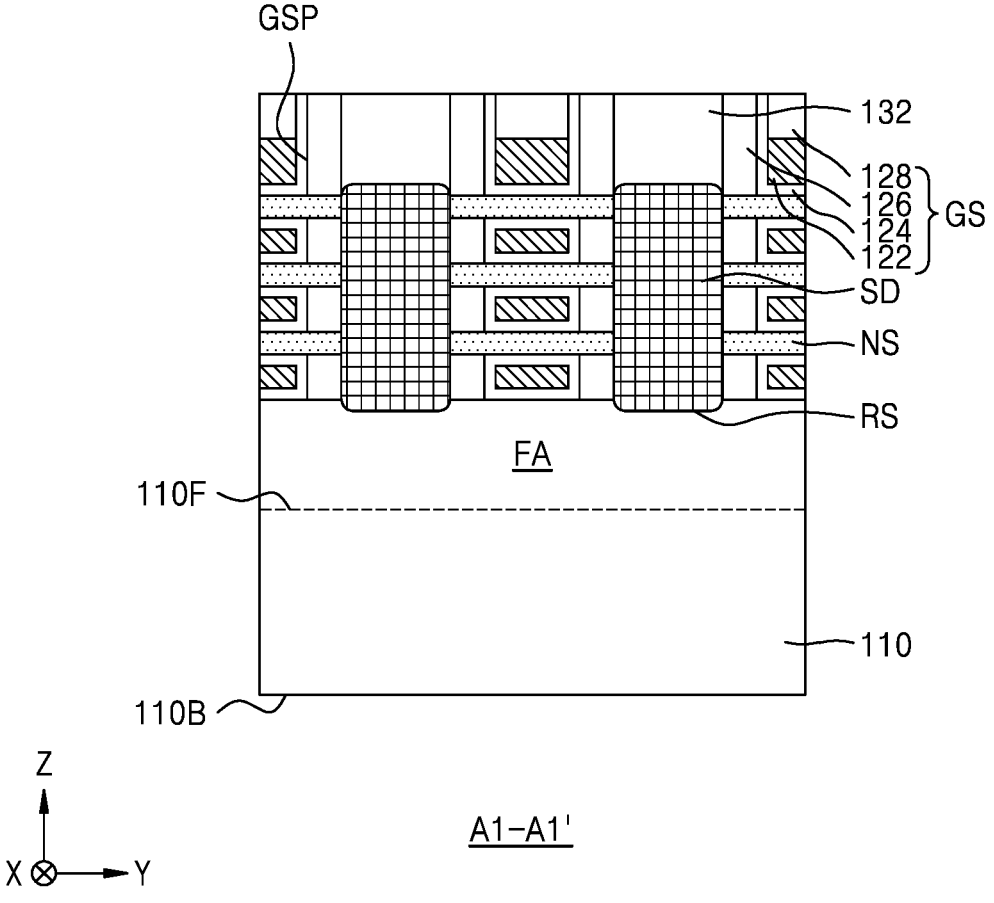
Figure 26B:
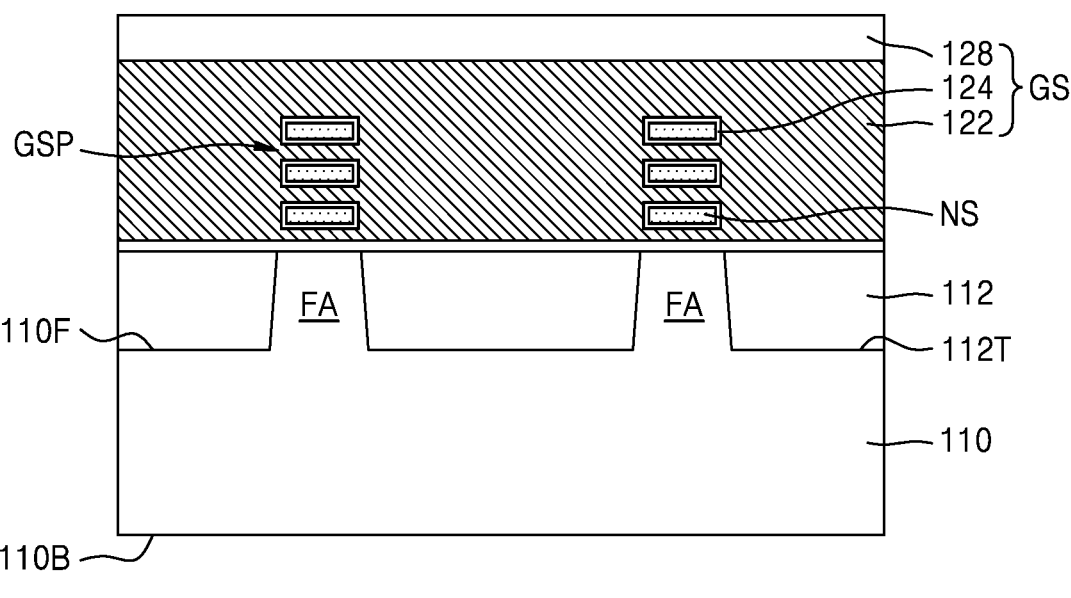

Referring to FIGS. 26A and 26B, a gate space GSP may be formed by removing the dummy gate line DGL and the dummy gate insulation layer DGI exposed through the inter-gate insulation layer 132.

Thereafter, a plurality of sacrificial layers 210 remaining on the fin-type active region FA are removed through the gate space GSP, thereby exposing the plurality of semiconductor patterns NS and the top surface of the fin-type active region FA. The gate space GSP may extend between the plurality of semiconductor patterns NS and between the lowermost semiconductor pattern NS and the fin-type active region FA. The process of removing the plurality of sacrificial layers 210 may be a wet etching process using etching selectivity (or a difference in etch rate) between the sacrificial layer 210 and the plurality of semiconductor patterns NS.

Thereafter, the gate insulation layer 124 may be formed on surfaces exposed in the gate space GSP. Thereafter, the gate electrode 122 filling the gate space GSP may be formed on the gate insulation layer 124. For example, after a work function metal-containing layer (not shown) is conformally formed on the inner wall of the gate space GSP, a gap-fill metal layer (not shown) may be formed on the work function conductive layer to fill the gate space GSP. Thereafter, the gate electrode 122 may be formed by planarizing the upper portion of the gap-fill metal layer until the top surface of the inter-gate insulation layer 132 is exposed.

According to embodiments, the work function metal-containing layer may include Al, Cu, Ti, Ta, W, Mo, TaN, NiSi, CoSi, TiN, WN, TiAl, TiAlC, TiAlN, TaCN, TaC, TaSiN, or a combination thereof. The gap-fill metal layer may include Al, Cu, Ti, Ta, W, Mo, TaN, NiSi, CoSi, TiN, WN, TiAl, TiAlC, TiAlN, TaCN, TaC, TaSiN, or a combination thereof.

Figure 27A:
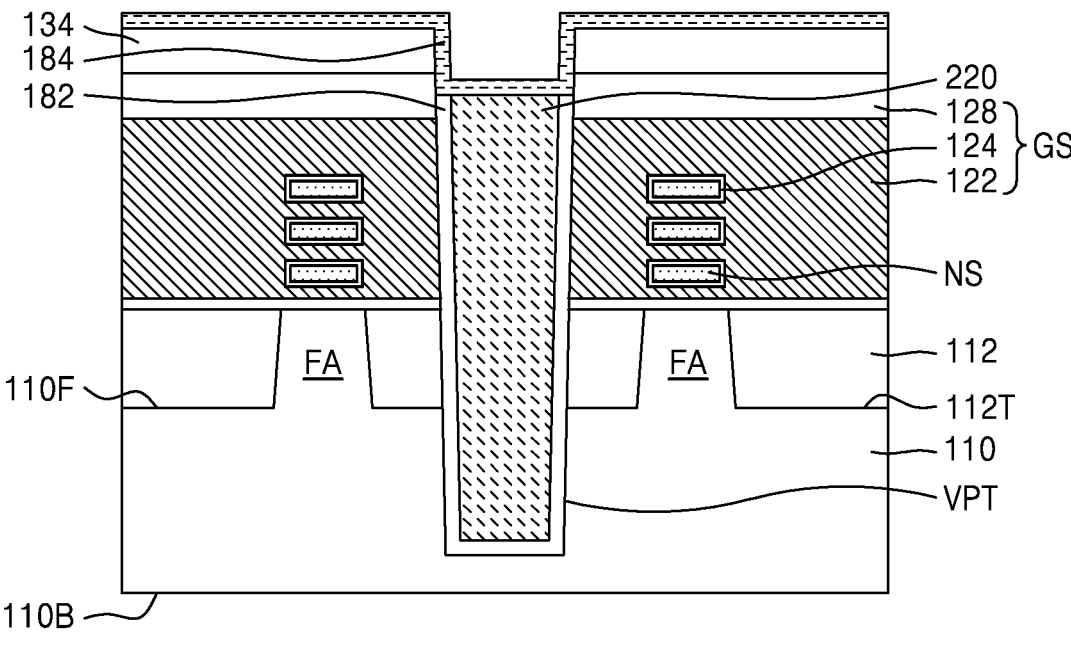
Figure 27B:
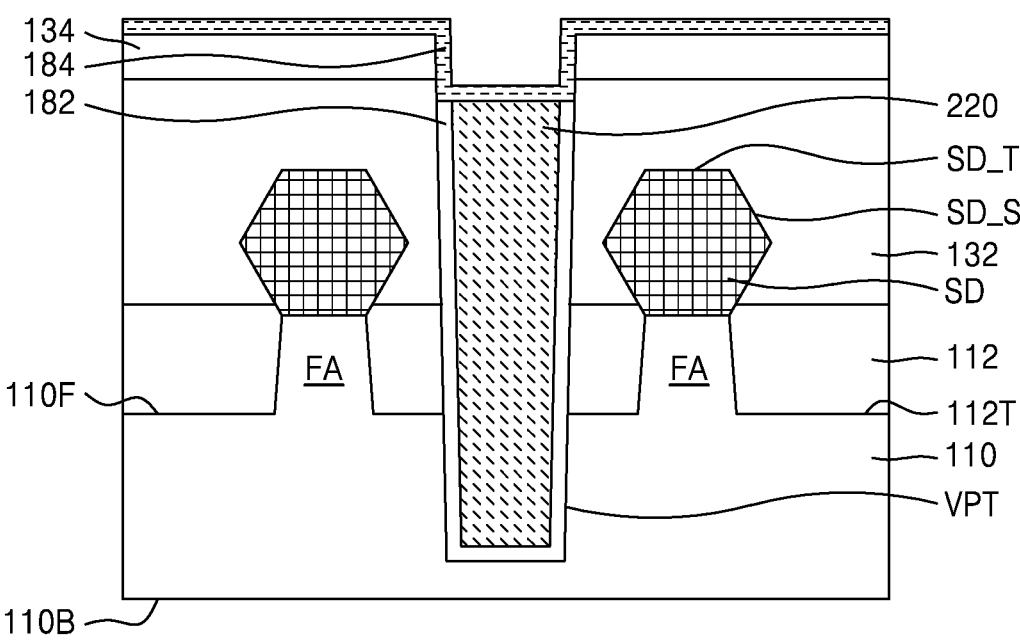
Figure 27B:
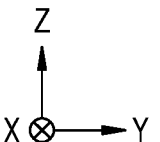

Referring to FIGS. 27A and 27B, the upper insulation layer 134 may be formed on the gate electrode 122 and the inter-gate insulation layer 132, a mask pattern (not shown) may be formed on the upper insulation layer 134, and portions of the gate electrode 122, the inter-gate insulation layer 132, and the upper insulation layer 134 may be removed by using the mask pattern as an etching mask, thereby forming the vertical power trench VPT extending into the substrate 110.

According to some embodiments, the vertical power trench VPT may also be formed by first forming the gate cut insulation layer GCI (refer to FIG. 13) by removing a portion of the gate electrode 122 and then removing a portion of the gate cut insulation layer GCI and a portion of the substrate 110.

Thereafter, the first liner 182 may be formed on the inner wall of the vertical power trench VPT, and a sacrificial plug 220 filling the interior of the first liner 182 may be formed. The first liner 182 may be formed using silicon nitride or silicon oxynitride. The sacrificial plug 220 may be formed using a spin-on hard mask (SOH), a spin-on dielectric (SOD), silicon carbide, or polysilicon, but the inventive concept is not limited thereto. The sacrificial plug 220 may be formed using a material having an etch selectivity with respect to the first liner 182.

Thereafter, the upper portion of the sacrificial plug 220 may be removed through a recess process, such that the top surface of the sacrificial plug 220 is disposed at a lower level than the top surface of the vertical power trench VPT. During the recess process, the upper portion of the first liner 182 is also removed. Therefore, the upper portion of the sidewall of the vertical power trench VPT may be exposed again, and the top surface of the first liner 182 may be disposed at a lower level than the top surface of the vertical power trench VPT (e.g., the top surface of the upper insulation layer 134).

Thereafter, the second liner 184 may be formed on the upper portion of the sidewall of the vertical power trench VPT. The second liner 184 may be conformally disposed on the top surface of the sacrificial plug 220 and the top surface of the upper insulation layer 134. According to embodiments, the second liner 184 may be formed using silicon oxide or silicon oxynitride.

Figure 28:
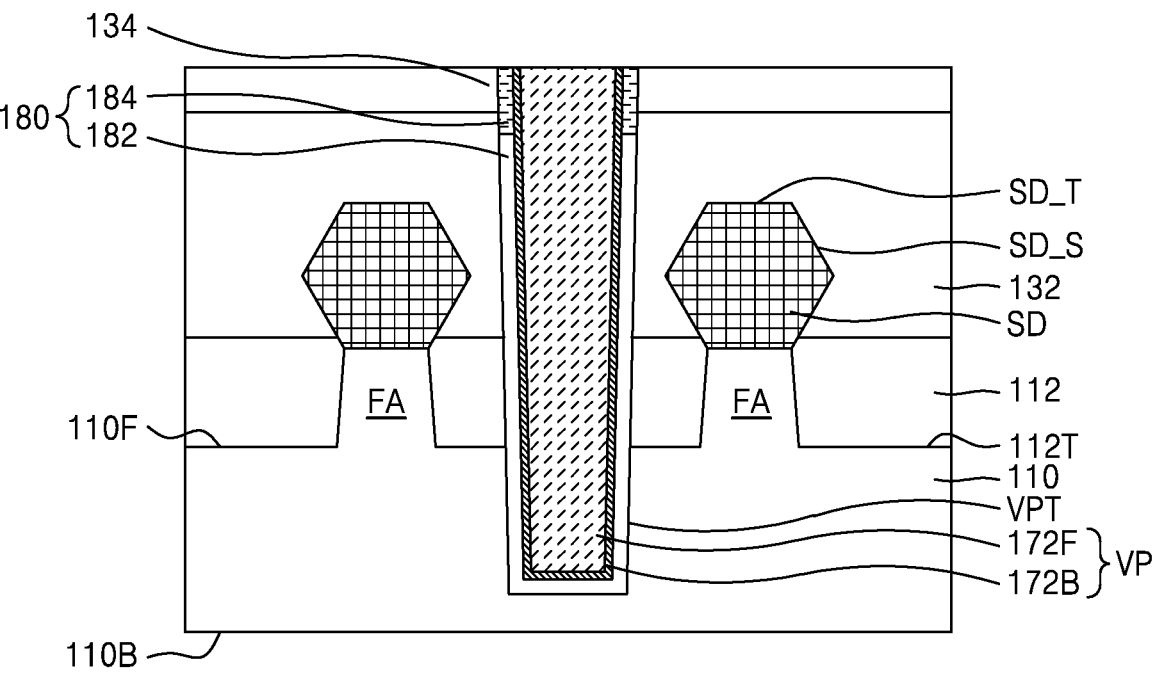
Figure 28:
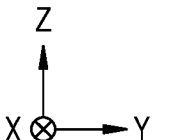

Referring to FIG. 28, the sacrificial plug 220 (refer to FIG. 27B) disposed on the inner wall of the vertical power trench VPT may be removed. At this time, a portion of the second liner 184 disposed on the top surface of the sacrificial plug 220 may also be removed, and a portion of the second liner 184 disposed on the upper insulation layer 134 may also be removed. Therefore, the liner structure 180 including the first liner 182 and the second liner 184 may be disposed on the sidewall of the vertical power trench VPT.

Thereafter, the vertical power wiring layer VP may be formed by sequentially forming the conductive barrier layer 172B and the wiring metal layer 172F in the vertical power trench VPT. The top surface of the vertical power wiring layer VP may be disposed on the same plane as the top surface of the upper insulation layer 134.

Figure 29:
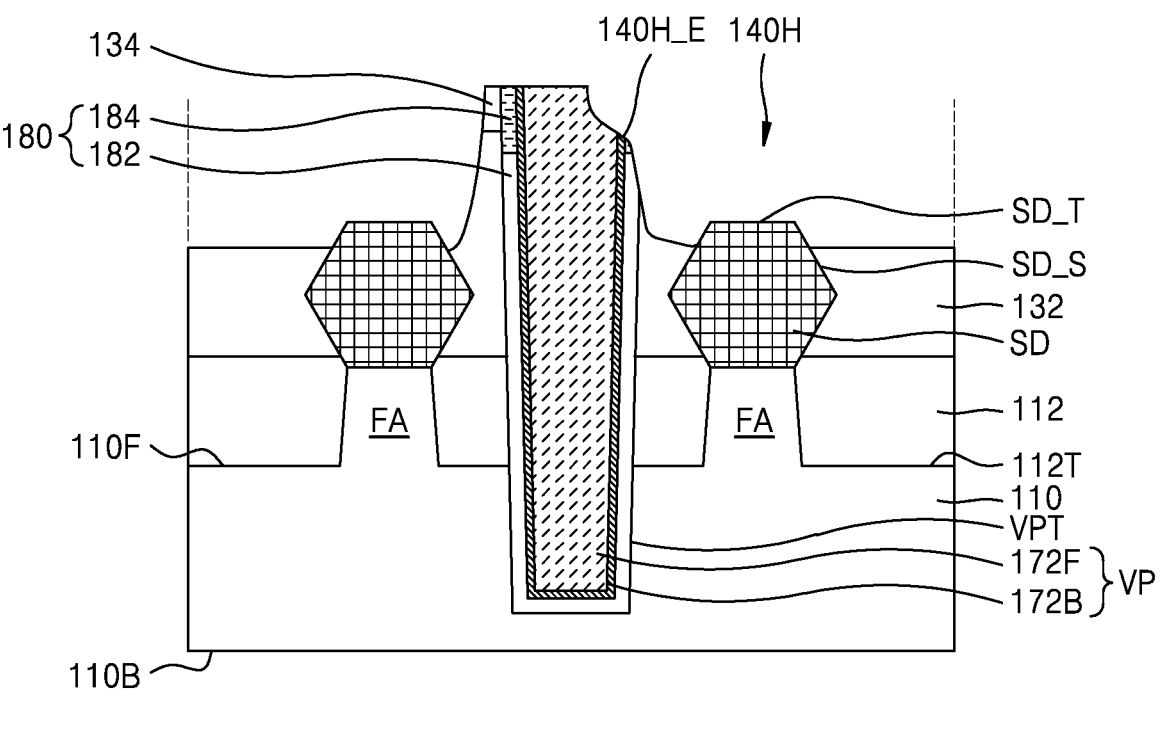

Referring to FIG. 29, a mask pattern (not shown) may be formed on the vertical power wiring layer VP and the upper insulation layer 134, and the first contact hole 140H may be formed by removing portions of the upper insulation layer 134 and the inter-gate insulation layer 132 by using the mask pattern as an etching mask. During the process of forming the first contact hole 140H, portions of the vertical power wiring layer VP and the liner structure 180 may also be removed, and thus a contact hole extension 140H_E may be formed.

For example, during the process of forming the first contact hole 140H, the second liner 184 may be disposed in the upper portion of the liner structure 180, and the second liner 184 may include a material having etching characteristics similar to those of the upper insulation layer 134 and/or the inter-gate insulation layer 132. Therefore, under etching process conditions for forming the first contact hole 140H, the etching rate of the upper insulation layer 134 and/or the inter-gate insulation layer 132 and the etching rate of the second liner 184 may be similar to each other, and thus the contact hole extension 140H_E may have a relatively flat bottom profile.

Figure 30A:
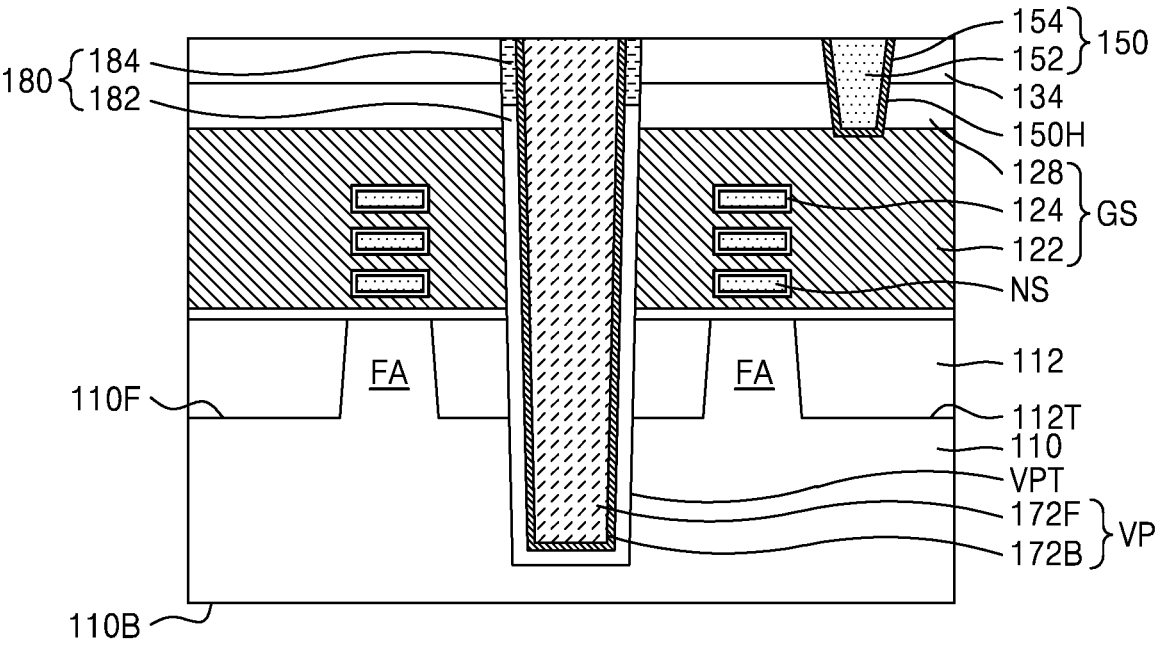
Figure 30B:
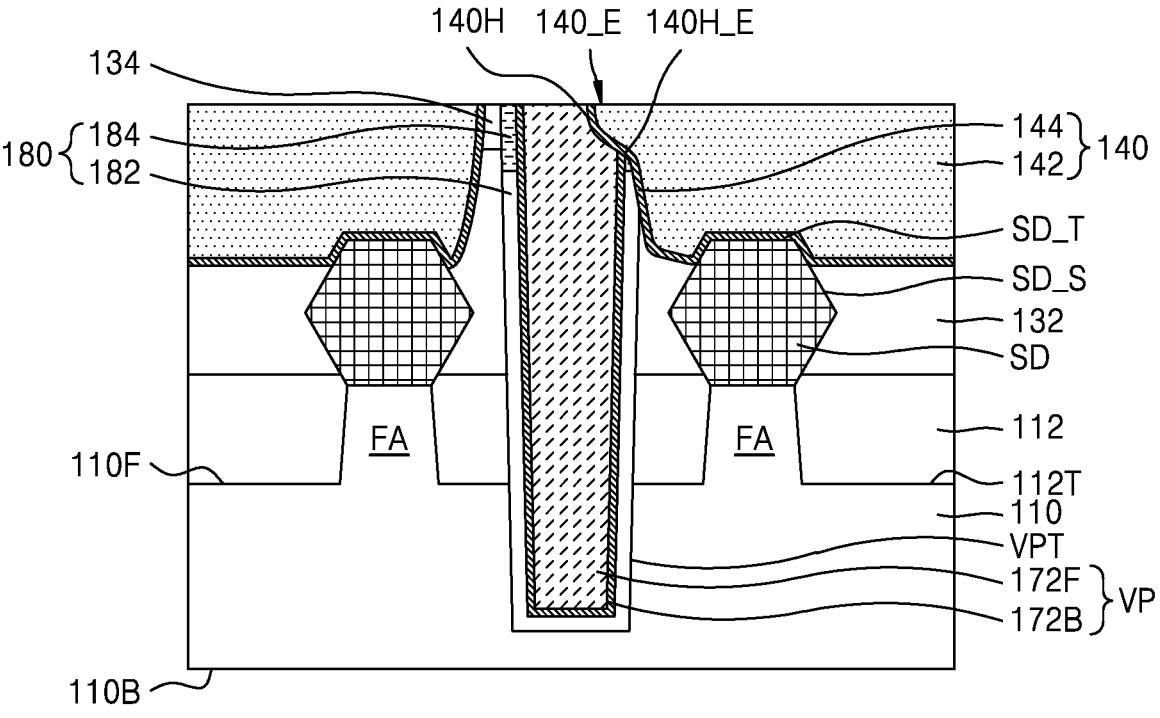

Referring to FIGS. 30A and 30B, the first contact 140 may be formed by sequentially forming the conductive barrier layer 144 and the contact plug 142 in the first contact hole 140H.

Thereafter, the second contact hole 150H may be formed by removing portions of the upper insulation layer 134 and the gate capping layer 128, and the second contact 150 may be formed by sequentially forming the conductive barrier layer 154 and the contact plug 152 inside the second contact hole 150H.

The front wiring structure FWS including the first wiring layer FML1, the second wiring layer FML2, the first via FV1, and the second via FV2 and the interlayer insulation layer 162 surrounding the front wiring structure FWS may be formed on the upper insulation layer 134.

Figure 31A:
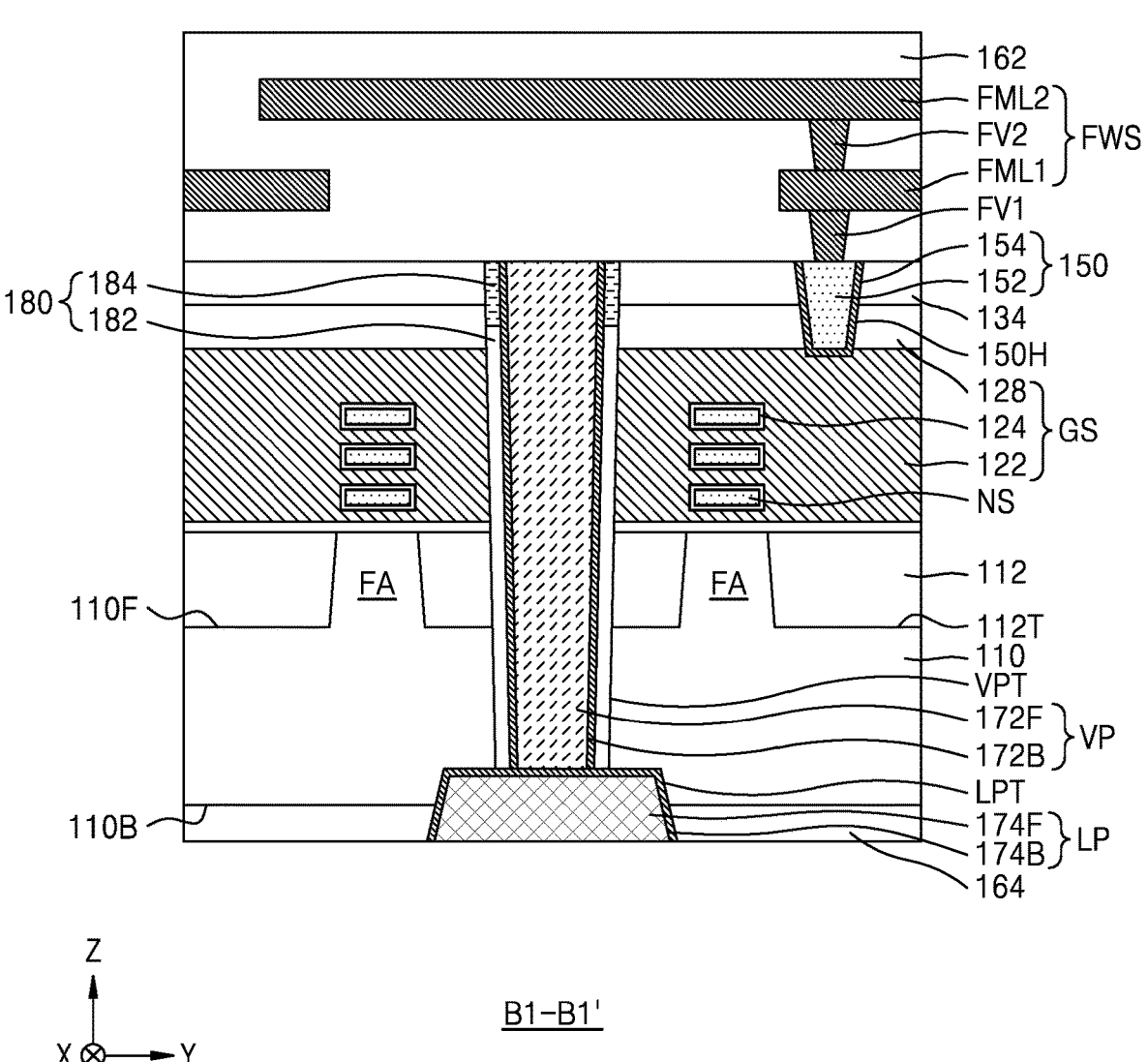
Figure 31B:
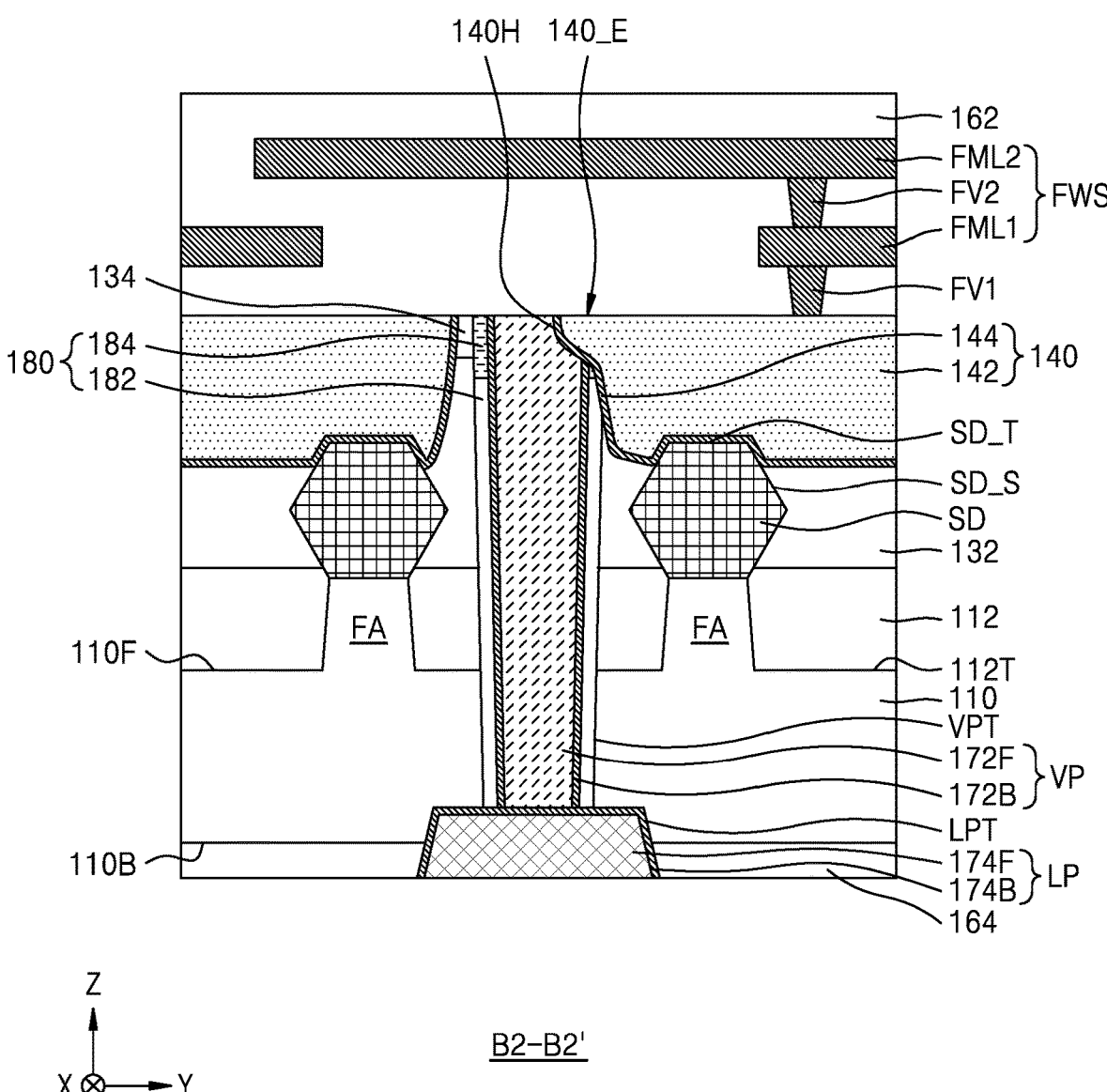

Referring to FIGS. 31A and 31B, the height of the substrate 110 in the vertical direction Z may be reduced by removing a portion of the substrate 110 from the second surface 110B of the substrate 110. Thereafter, a portion of the back interlayer insulation layer 164 may be formed on the second surface 110B of the substrate 110.

The landing pad trench LPT connected to the vertical power trench VPT may be formed by removing a portion of the back interlayer insulation layer 164 and a portion of the substrate 110. The landing pad trench LPT may be formed to extend in the first horizontal direction X. At this time, the bottom surface of the first liner 182 may be exposed on the inner wall of the landing pad trench LPT. Thereafter, the bottom portion of the first liner 182 and the bottom portion of the conductive barrier layer 172B may be removed, thereby exposing the bottom surface of the wiring metal layer 172F.

Thereafter, the landing pad LP may be formed inside the landing pad trench LPT by sequentially forming the conductive barrier layer 174B and the pad metal layer 174F inside the landing pad trench LPT and removing unnecessary portions through a planarization process.

Referring back to FIG. 4, the back wiring structure BWS including the first back wiring layer BML1, the second back wiring layer BML2, the first back via BV1, and the second back via BV2 and a portion of the back interlayer insulation layer 164 surrounding the back wiring structure BWS may be formed on the second surface 110B of the substrate 110.

The integrated circuit device 100 may be formed through the above-stated operations. According to embodiments, a relatively large contact area between the first contact hole 140H and the vertical power wiring layer VP may be obtained in the process of forming the first contact hole 140H, and a bridging defect between the gate electrode 122 and the first contact hole 140H may be prevented.

FIG. 32 is a cross-sectional view showing a method of manufacturing the integrated circuit device 100B according to example embodiments.

First, the operations described above with reference to FIGS. 23 to 27B are performed to form a structure in which the vertical power trench VPT, the first liner 182, and the sacrificial plug 220 are formed.

Referring to FIG. 32, the sacrificial plug 220 is removed to leave only the first liner 182 inside the vertical power trench VPT. Thereafter, the second liner 184 may be formed on the inner wall of the vertical power trench VPT. Therefore, a structure in which only the second liner 184 is disposed on the upper portion of the sidewall of the vertical power trench VPT and the first liner 182 and the second liner 184 are arranged on the lower portion of the sidewall of the vertical power trench VPT may be formed.

Thereafter, the operations described above with reference to FIGS. 28 to 31B may be performed. In this case, the integrated circuit device 100B described with reference to FIGS. 8 and 9 may be formed.

FIG. 33 is a block diagram showing a system-on-chip (SoC) 320 according to an example embodiment. The SoC 320 is a semiconductor device and may include an integrated circuit according to an embodiment. The SoC 320 is a single chip on which complex functional blocks like intellectual property (IP) performing various functions are implemented. Standard cells and a power rail according to an embodiment may be included in each of functional blocks of the SoC 320, and thus the SoC 320 with improved degree of integration and improved routing freedom may be implemented.

Referring to FIG. 33, the SoC 320 may include a modem 322, a display controller 323, a memory 324, an external memory controller 325, a central processing unit (CPU) 326, a transaction unit 327, a PMIC 328, and a graphic processing unit (GPU) 329, wherein functional blocks of the SoC 320 may communicate with one another through a system bus 321.

The CPU 326 capable of controlling the overall operation of the SoC 320 may control operations of other functional blocks 322 to 329. The modem 322 may demodulate signals received from the outside of the SoC 320 or modulate signals generated inside the SoC 320 and transmit modulated signals to the outside. The external memory controller 325 may control operations for transmitting and receiving data to and from an external memory device connected to the SoC 320. For example, programs and/or data stored in an external memory device may be provided to the CPU 326 or the GPU 329 under the control of the external memory controller 325. The GPU 329 may execute program instructions related to graphics processing. The GPU 329 may receive graphics data through the external memory controller 325 or transmit graphics data processed by the GPU 329 to the outside of the SoC 320 through the external memory controller 325. The transaction unit 327 may monitor data transactions of functional blocks, and the PMIC 328 may control powers supplied to the functional blocks under the control of the transaction unit 327. The display controller 323 may control a display (or a display device) outside the SoC 320, thereby transmitting data generated inside the SoC 320 to the display.

The memory 324 may include a non-volatile memory such as, for example, an electrically erasable/programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), and a ferroelectric random access memory (FRAM) or a volatile memory like a dynamic random access memory (DRAM, a static random access memory (SRAM), a mobile DRAM, a double data rate (DDR) synchronous dynamic random access memory (SDRAM), a low power DDR (LPDDR) SDRAM, a graphic DDR (GDDR) SDRAM, and a Rambus dynamic random access memory (RDRAM).

FIG. 34 is a block diagram showing a computing system 330 including a memory storing a program according to an example embodiment. At least some of operations included in a method of manufacturing an integrated circuit according to embodiments may be performed by the computing system 330.

The computing system 330 may be a stationary computing system like a desktop computer, a workstation, or a server or a portable computing system like a laptop computer. As shown in FIG. 34, the computing system 330 may include a processor 331, input/output devices 332, a network interface 333, a RAM 334, a ROM 335, and a storage device 336. The processor 331, the input/output devices 332, the network interface 333, the RAM 334, the ROM 335, and the storage device 336 may be connected to a bus 337 and may communicate with one another through the bus 337.

The processor 331 may be referred to as a processing unit and, for example, may include at least one core, e.g., a micro-processor, an application processor (AP), a digital signal processor (DSP), a graphics processing unit (GPU), etc., capable of executing an arbitrary instruction set (e.g., Intel Architecture-32 (IA-32), 64-bit extended IA-32, x86-64, PowerPC, Sparc, MIPS, ARM, IA-64, etc.). For example, the processor 331 may access a memory, that is, the RAM 334 or the ROM 335, through the bus 337 and may execute instructions stored in the RAM 334 or the ROM 335.

The RAM 334 may store a program 340 for a method of manufacturing an integrated circuit according to an embodiment or at least a portion of the program 340, and the program 340 may instruct the processor 331 to perform at least some of operations included in the method of manufacturing an integrated circuit. In other words, the program 340 may include a plurality of instructions executable by the processor 331, and the plurality of instructions included in the program 340 may control the processor 331 to perform a logic synthesis operation and/or a place and routing (P&R) operation.

The storage device 336 may not lose stored data even when power supplied to the computing system 330 is cut off. For example, the storage device 336 may include a non-volatile memory device or a storage medium such as, for example, a magnetic tape, an optical disk, or a magnetic disk. Also, the storage device 336 may be detachable from the computing system 330. The storage device 336 may store the program 340 according to an embodiment of the inventive concept, and, before the program 340 is executed by the processor 331, the program 340 or at least a part thereof may be loaded to the RAM 334. Alternatively, the storage device 336 may store a file written in a program language, and the program 340 generated from the file by a compiler or the like or at least a part of the program 340 may be loaded to the RAM 334. Also, as shown in FIG. 34, the storage device 336 may store a database (DB) 350, and the DB 350 may include information needed for designing an integrated circuit.

The storage device 336 may store data to be processed by the processor 331 or data processed by the processor 331. In other words, the processor 331 may generate data by processing data stored in the storage device 336 according to the program 340 and may store generated data in the storage device 336.

The input/output devices 332 may include an input device like a keyboard and a pointing device and may include an output device like a display device and a printer. For example, a user may trigger execution of the program 340 by the processor 331 through the input/output devices 332.

The network interface 333 may provide access to a network outside the computing system 330. For example, a network may include a plurality of computing systems and communication links, and the communication links may include wired links, optical links, wireless links, or any other types of links.

While the inventive concept has been particularly shown and described with reference to embodiments thereof, it will be understood that various changes in form and details may be made therein without departing from the spirit and scope of the following claims.

What is claimed is:

1. An integrated circuit device comprising:
   a substrate having a first surface and a second surface opposite to the first surface;
   a plurality of semiconductor patterns spaced apart from one another in a vertical direction on the first surface of the substrate;
   a gate electrode extending in a first horizontal direction and surrounding the plurality of semiconductor patterns;
   a source/drain region disposed on one side of the gate electrode and connected to the plurality of semiconductor patterns;
   a vertical power wiring layer spaced apart from the source/drain regions-region in the first horizontal direction and extending in a second horizontal direction;
   a liner structure disposed on a sidewall of the vertical power wiring layer and comprising a first liner and a second liner, the first liner being disposed on a lower portion of the sidewall of the vertical power wiring layer and comprising a first insulating material, and the second liner being disposed on an upper portion of the sidewall of the vertical power wiring layer and comprising a second insulating material different from the first insulating material;
   a first contact disposed on a top surface of the source/drain region and a top surface of the vertical power wiring layer; and
   a back wiring structure disposed on the second surface of the substrate and electrically connected to the vertical power wiring layer.

2. The integrated circuit device of claim 1,
   wherein a top surface of the first liner is disposed at a vertical level lower than that of the top surface of the vertical power wiring layer, and
   wherein a bottom surface of the first liner is disposed at a same vertical level as a bottom surface of the vertical power wiring layer.

3. The integrated circuit device of claim 1,
   wherein the vertical power wiring layer has a first height in the vertical direction, and
   wherein the first liner has a second height smaller than the first height in the vertical direction.

4. The integrated circuit device of claim 1, further comprising:
   an inter-gate insulation layer covering sidewalls of the gate electrode and the source/drain region, on the first surface of the substrate,
   wherein the vertical power wiring layer and the liner structure are arranged in a vertical power trench that extends into the substrate through the inter-gate insulation layer.

5. The integrated circuit device of claim 4,
   wherein the first contact comprises an extension contacting an upper portion of the vertical power wiring layer, and
   wherein the second liner is in contact with the extension of the first contact.

6. The integrated circuit device of claim 4, wherein the first liner is disposed between the inter-gate insulation layer and the vertical power wiring layer, at a same vertical level as a top surface of the gate electrode.

7. The integrated circuit device of claim 4, wherein a top surface of the first liner is disposed at a higher vertical level than a top surface of the gate electrode.

8. The integrated circuit device of claim 7, wherein the second liner and the first liner are arranged between the inter-gate insulation layer and the vertical power wiring layer at a same vertical level as a top surface of the gate electrode.

9. The integrated circuit device of claim 4,
   wherein a portion of the second liner extends in the vertical direction on the lower portion of the sidewall of the vertical power wiring layer, and
   wherein the portion of the second liner is disposed between the first liner and the vertical power wiring layer.

10. The integrated circuit device of claim 1, wherein the first insulating material comprises silicon nitride and the second insulating material comprises silicon oxide.

11. The integrated circuit device of claim 1, further comprising:
   a landing pad disposed in a landing pad trench extending from the second surface of the substrate into the substrate and connected to the vertical power wiring layer,
   wherein a top surface of the landing pad is in contact with a bottom surface of the vertical power wiring layer, and
   wherein a bottom surface of the landing pad is connected to the back wiring structure.

12. The integrated circuit device of claim 11, wherein a power voltage is applied from the back power wiring structure to the source/drain region through the vertical power wiring layer, the landing pad, and the first contact.

13. An integrated circuit device comprising:
   a substrate having a first surface and a second surface opposite to the first surface;
   an active region disposed on the first surface of the substrate;
   a gate electrode disposed on the active region and extending in a first horizontal direction;
   a source/drain region disposed on one side of the gate electrode;
   an inter-gate insulation layer covering sidewalls of the gate electrode and the source/drain region, on the first surface of the substrate;
   a liner structure disposed on a sidewall of a vertical power trench that extends into the substrate through the inter-gate insulation layer, the liner structure comprising a first liner and a second liner, wherein the first liner is disposed on a lower portion of the sidewall of the vertical power trench, and the second liner is disposed on an upper portion of the sidewall of the vertical power trench;
   a vertical power wiring layer disposed in the vertical power trench, with both sidewalls of the vertical power wiring layer being covered by the liner structure;
   a first contact disposed on a top surface of the source/drain region and a top surface of the vertical power wiring layer; and
   a back wiring structure disposed on the second surface of the substrate and electrically connected to the vertical power wiring layer.

14. The integrated circuit device of claim 13,
   wherein the vertical power wiring layer is spaced apart from the source/drain region in the first horizontal direction and extends in a second horizontal direction, and wherein the vertical power wiring layer comprises a bottom surface and the top surface opposite to the bottom surface, wherein the bottom surface is closer to the second surface of the substrate.

15. The integrated circuit device of claim 14,
   wherein a top surface of the first liner is disposed at a vertical level lower than that of the top surface of the vertical power wiring layer, and
   wherein a bottom surface of the first liner is disposed at a same vertical level as the bottom surface of the vertical power wiring layer.

16. The integrated circuit device of claim 14,
   wherein the second liner is disposed between the inter-gate insulation layer and the vertical power wiring layer, at a same vertical level as a top surface of the first contact, and
   wherein a top surface of the first liner is disposed at a higher vertical level than a top surface of the gate electrode.

17. The integrated circuit device of claim 14, wherein the first liner is disposed between the inter-gate insulation layer and the vertical power wiring layer, at a same vertical level as a top surface of the gate electrode.

18. The integrated circuit device of claim 13,
   wherein the first liner comprises a first insulating material and the second liner comprises a second insulating material different from the first insulating material, and
   wherein the first insulating material comprises silicon nitride and the second insulating material comprises silicon oxide.

19. An integrated circuit device comprising:
   a substrate comprising a first surface and a second surface;
   a plurality of logic cells arranged on the first surface of the substrate; and
   a back wiring structure disposed on the second surface of the substrate and configured to supply power to the plurality of logic cells,
   wherein each of the plurality of logic cells comprises:
      a plurality of semiconductor patterns spaced apart from one another in a vertical direction on the first surface of the substrate;
      a gate electrode extending in a first horizontal direction and surrounding the plurality of semiconductor patterns;
      a source/drain region disposed on one side of the gate electrode and connected to the plurality of semiconductor patterns;
      an inter-gate insulation layer covering sidewalls of the gate electrode and the source/drain region, on the first surface of the substrate;
      a liner structure disposed on a sidewall of a vertical power trench that extends into the substrate through the inter-gate insulation layer, the liner structure comprising a first liner and a second liner, wherein the first liner is disposed on a lower portion of the sidewall of the vertical power trench, and the second liner is disposed on an upper portion of the sidewall of the vertical power trench;
      a vertical power wiring layer disposed in the vertical power trench, with both sidewalls of the vertical power wiring layer being covered by the liner structure; and
      a first contact disposed on a top surface of the source/drain region and a top surface of the vertical power wiring layer, wherein a top surface of the first liner is disposed at a higher vertical level than a top surface of the gate electrode, and wherein the first liner comprises silicon nitride and the second liner comprises silicon oxide.

20. The integrated circuit device of claim 19, wherein a power voltage is applied from the back wiring structure to the source/drain region through the vertical power wiring layer and the first contact.

* * * * *